(12) United States Patent
Yang

(10) Patent No.: US 12,406,922 B2
(45) Date of Patent: Sep. 2, 2025

(54) SEMICONDUCTOR STRUCTURE AND MANUFACTURING METHOD THEREOF

(71) Applicant: MACRONIX International Co., Ltd., Hsinchu (TW)

(72) Inventor: Chin-Cheng Yang, Kaohsiung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 509 days.

(21) Appl. No.: 17/900,587

(22) Filed: Aug. 31, 2022

(65) Prior Publication Data

US 2024/0071906 A1 Feb. 29, 2024

(51) Int. Cl.
*H01L 23/522* (2006.01)
*H01L 21/768* (2006.01)

(52) U.S. Cl.
CPC ........ *H01L 23/5226* (2013.01); *H01L 21/768* (2013.01)

(58) Field of Classification Search
CPC .......................... H01L 23/5226; H01L 21/768
USPC .......................................................... 257/773
See application file for complete search history.

(56) References Cited

U.S. PATENT DOCUMENTS 9,941,153 B1 4/2018 Yang
2023/0069307 A1* 3/2023 Shimomura ........... H10B 43/35

FOREIGN PATENT DOCUMENTS

TW I685936 2/2020
TW 202044507 12/2020
TW 202133282 9/2021

OTHER PUBLICATIONS

"Office Action of Taiwan Counterpart Application", issued on May 16, 2023, pp. 1-4.

* cited by examiner

Primary Examiner — Tu-Tu V Ho
(74) Attorney, Agent, or Firm — J.C. PATENTS

(57) ABSTRACT

A semiconductor structure including a substrate and a pad structure is provided. The pad structure is located on the substrate. The pad structure includes material pairs and pads. The material pairs are stacked on the substrate to form a stair step structure. Each of the material pairs includes a conductive layer and a dielectric layer located on the conductive layer. Each of the pads includes a conductive pillar and a pad layer. The conductive pillar is embedded in the material pair and is connected to the conductive layer of the material pair. The pad layer is located on the conductive pillar.

19 Claims, 24 Drawing Sheets

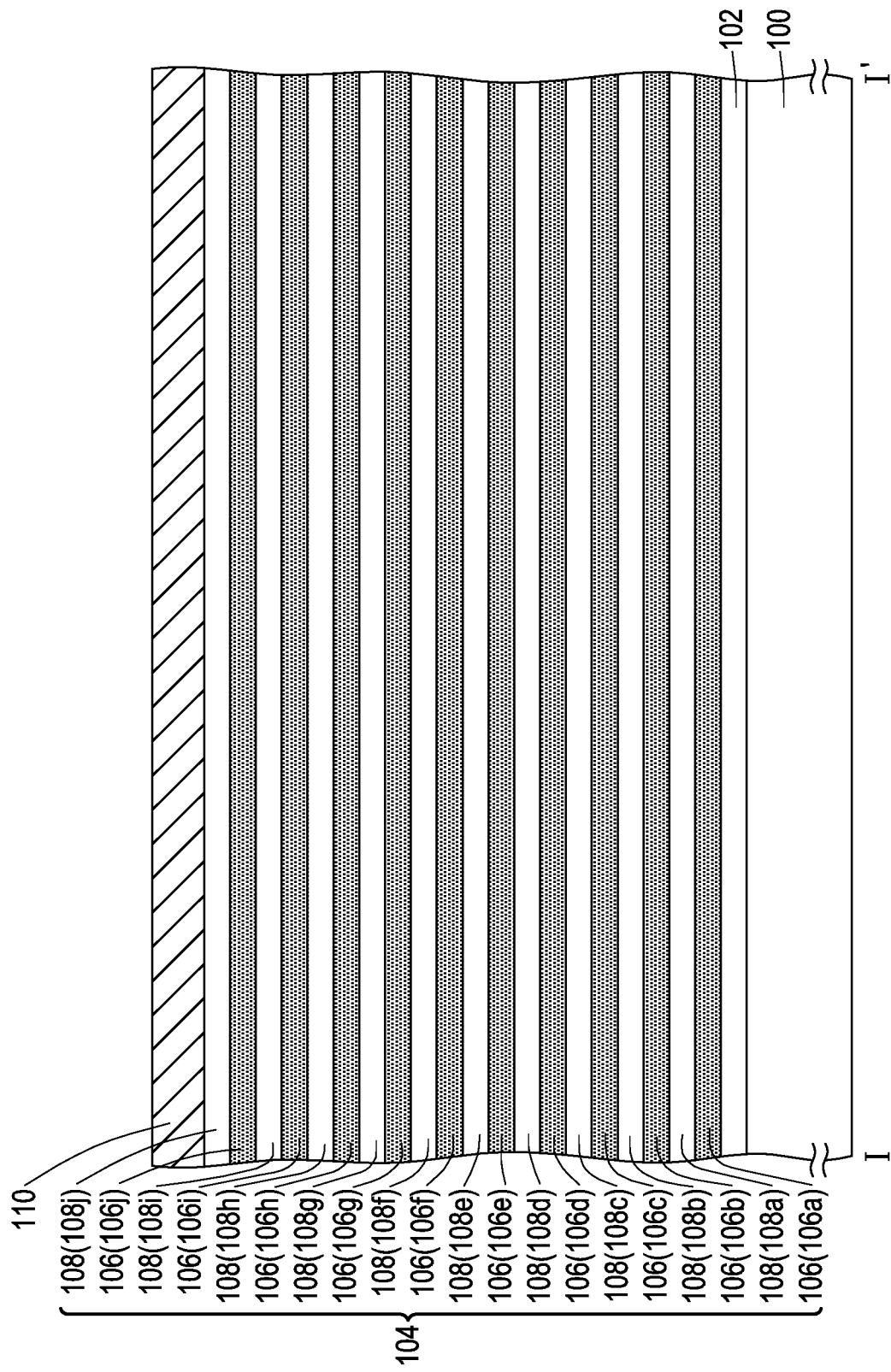

SEMICONDUCTOR STRUCTURE AND MANUFACTURING METHOD THEREOF

BACKGROUND

Technical Field

The invention relates to a semiconductor structure and a manufacturing method thereof, and particularly relates to a semiconductor structure having a pad structure and a manufacturing method thereof.

Description of Related Art

As the integrity of the memory device increases, in order to achieve high density and high performance, it is more and more common to replace the two-dimensional (2D) memory devices with the three-dimensional (3D) memory devices. One of the 3D memory devices is the vertical memory device. Although the vertical memory device can increase the memory capacity per unit area, the interconnection difficulty in the vertical memory device also increases.

In general, conductive layers with a stair step structure often serves as pads in the 3D memory device, and the pad and the contact thereon often serve as the interconnection structure to connect the component in each layer to other component. However, during the etching process for forming the contact opening, since the pads at different positions in the stair step structure have different distances from the top surface of the dielectric layer on the pads, the topmost pad of the stair step structure may be over-etched, and thus the contact opening penetrates the topmost pad and extend to the conductive layer below the topmost pad. In this way, the electrical failure of the device will be caused due to the undesired bridging between the subsequently formed contact and other pad or conductive layer. Therefore, how to prevent the electrical failure caused by over-etching during the process of manufacturing the contact opening is an important issue at present.

SUMMARY

The invention provides a semiconductor structure and a manufacturing method thereof, which can prevent the electrical failure caused by over-etching during the process of manufacturing the contact opening.

The invention provides a semiconductor structure, which includes a substrate and a pad structure. The pad structure is located on the substrate. The pad structure includes material pairs and pads. The material pairs are stacked on the substrate to form a stair step structure. Each of the material pairs includes a conductive layer and a dielectric layer located on the conductive layer. Each of the pads includes a conductive pillar and a pad layer. The conductive pillar is embedded in the material pair and is connected to the conductive layer of the material pair. The pad layer is located on the conductive pillar.

According to an embodiment of the invention, in the semiconductor structure, the thickness of the pad may be greater than the thickness of the conductive layer.

According to an embodiment of the invention, in the semiconductor structure, the thickness of the pad may be 2 to 4 times the thickness of the conductive layer.

According to an embodiment of the invention, in the semiconductor structure, the thickness of the pad may be greater than the thickness of the material pair.

According to an embodiment of the invention, in the semiconductor structure, the conductive layer, the conductive pillar, and the pad layer may be integrally formed.

According to an embodiment of the invention, in the semiconductor structure, the bottom surface of the conductive pillar and the bottom surface of the conductive layer may be coplanar.

According to an embodiment of the invention, in the semiconductor structure, the pad layer may be located on the top surface of the dielectric layer on two sides of the conductive pillar.

According to an embodiment of the invention, in the semiconductor structure, the width of the pad layer may be greater than the width of the conductive pillar.

According to an embodiment of the invention, in the semiconductor structure, the thickness of the pad layer may be greater than or equal to half of the width of the conductive pillar.

According to an embodiment of the invention, in the semiconductor structure, the top-view pattern of the conductive pillars may include a polygon, a circle, or an ellipse.

According to an embodiment of the invention, in the semiconductor structure, the size of the top-view pattern of the pad layer may be greater than the size of the top-view pattern of the conductive pillar.

According to an embodiment of the invention, in the semiconductor structure, there may be a gap between the edge of the top-view pattern of the pad layer and the edge of the top-view pattern of the conductive pillar, and the gap may surround the top-view pattern of the conductive pillar.

According to an embodiment of the invention, in the semiconductor structure, two opposite side edges of the top-view pattern of the pad layer and two opposite side edges of the top-view pattern of the conductive pillar may be flush with each other.

According to an embodiment of the invention, the semiconductor structure may further include contacts. The contact may be electrically connected to the pad.

According to an embodiment of the invention, in the semiconductor structure, the width of the pad layer may be greater than the width of the bottom of the contact.

According to an embodiment of the invention, in the semiconductor structure, the contacts in different regions may have different landing depths.

According to an embodiment of the invention, the semiconductor structure may further include a protection layer. The protection layer is located between the stair step structure and the substrate.

According to an embodiment of the invention, in the semiconductor structure, the edge of the pad layer may exceed the edge of the conductive layer.

According to an embodiment of the invention, in the semiconductor structure, the horizontal spacing between two adjacent pad layers may be substantially equal to the thickness of the pad layer.

The invention provides a manufacturing method of a semiconductor structure, which includes the following steps. A substrate is provided. A pad structure is formed on the substrate. The pad structure includes material pairs and pads. The material pairs are stacked on the substrate to form a first stair step structure. Each of the material pairs includes a conductive layer and a first dielectric layer located on the conductive layer. Each of the pads includes a conductive pillar and a pad layer. The conductive pillar is embedded in the material pair and is connected to the conductive layer of the material pair. The pad layer is located on the conductive pillar.

Based on the above description, in the semiconductor structure and the manufacturing method thereof according to the invention, each of the pads includes the conductive pillar and the pad layer, the conductive pillar is embedded in the material pair and is connected to the conductive layer of the material pair, and the pad layer is located on the conductive pillar. Therefore, compared with the conventional pad, the pad of the invention can have greater thickness, thereby preventing the electrical failure caused by over-etching during the process of manufacturing the contact opening. In addition, since the thicker pad is used as the etching stop layer during formation of the contact opening, the process window of the contact opening can be improved and the process yield can be increased.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1B:
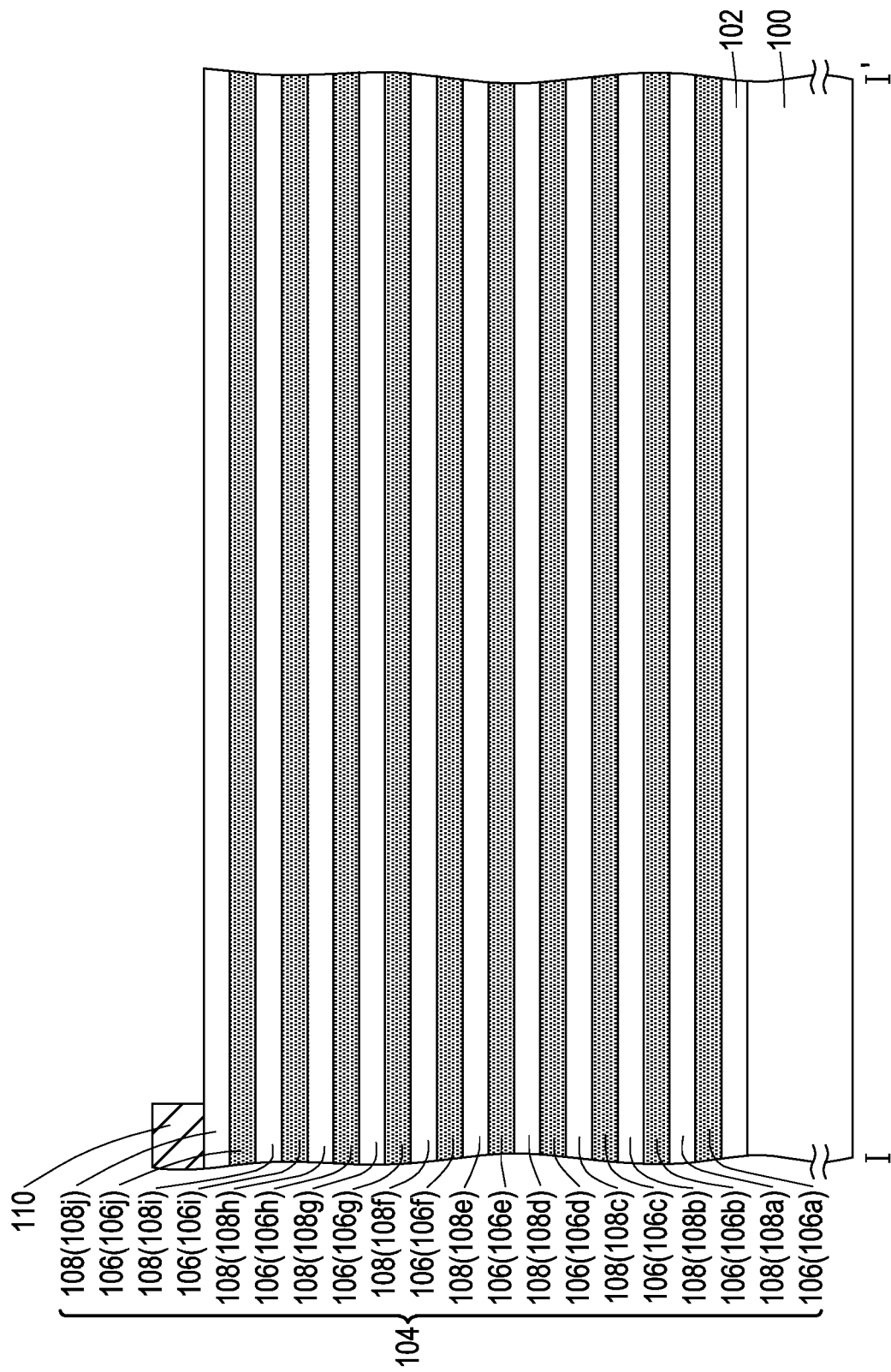
FIG. 1A to FIG. 1Q are cross-sectional views illustrating a manufacturing process of a semiconductor structure according to some embodiments of the invention.
FIG. 1R is cross-sectional view illustrating a semiconductor structure according to other embodiments of the invention.
Figure 1C:
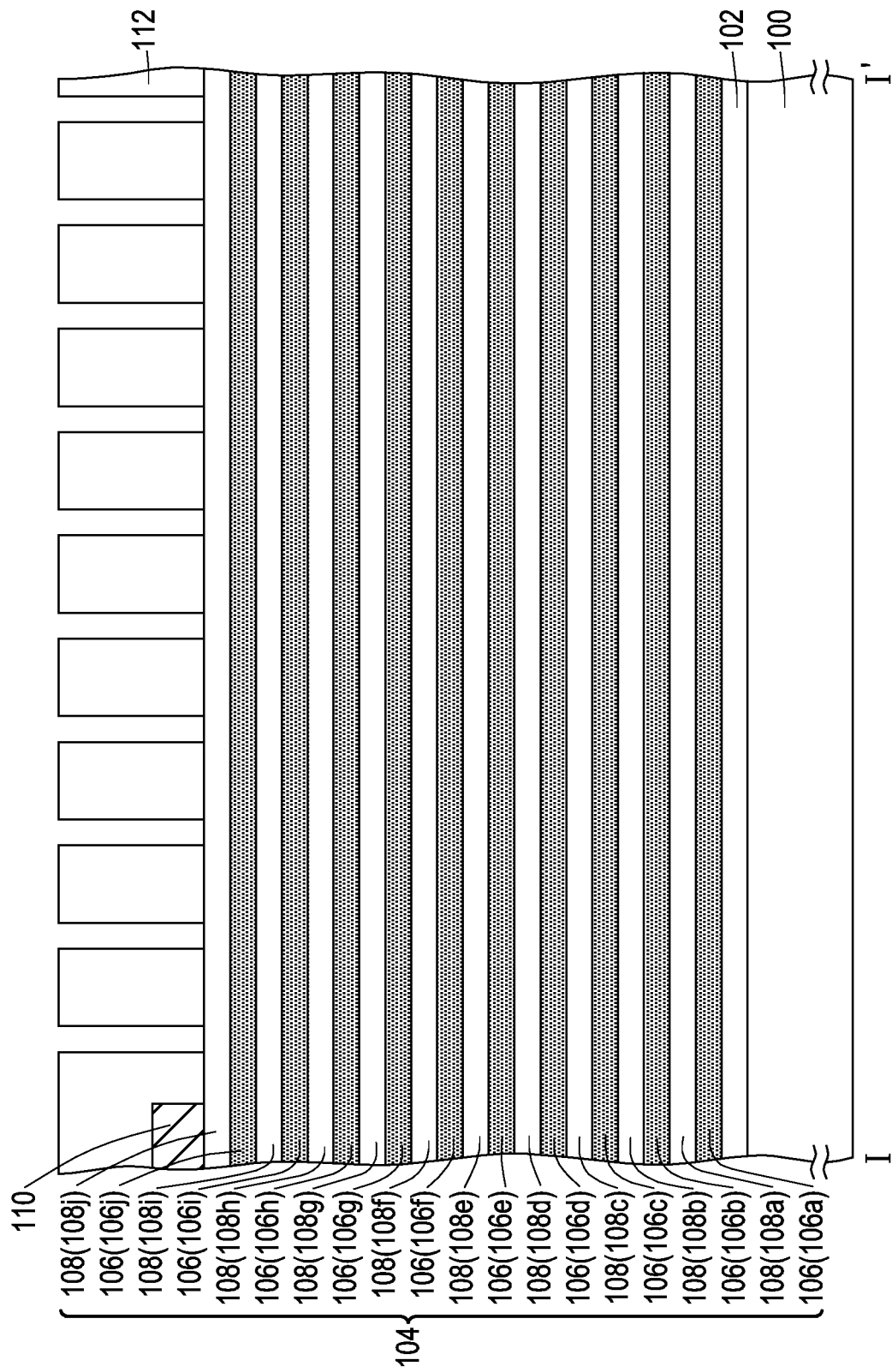
Figure 1D:
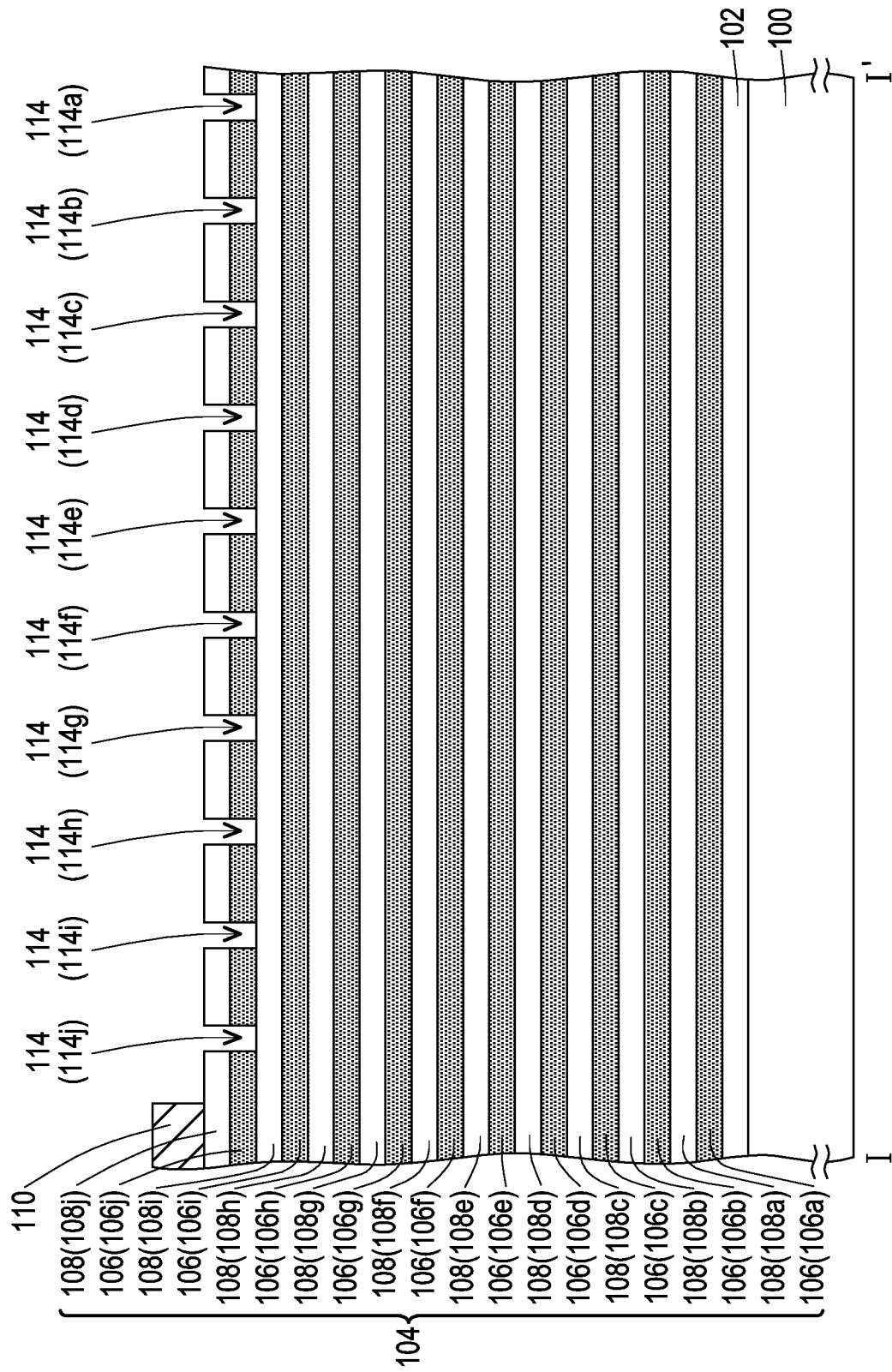
Figure 1E:
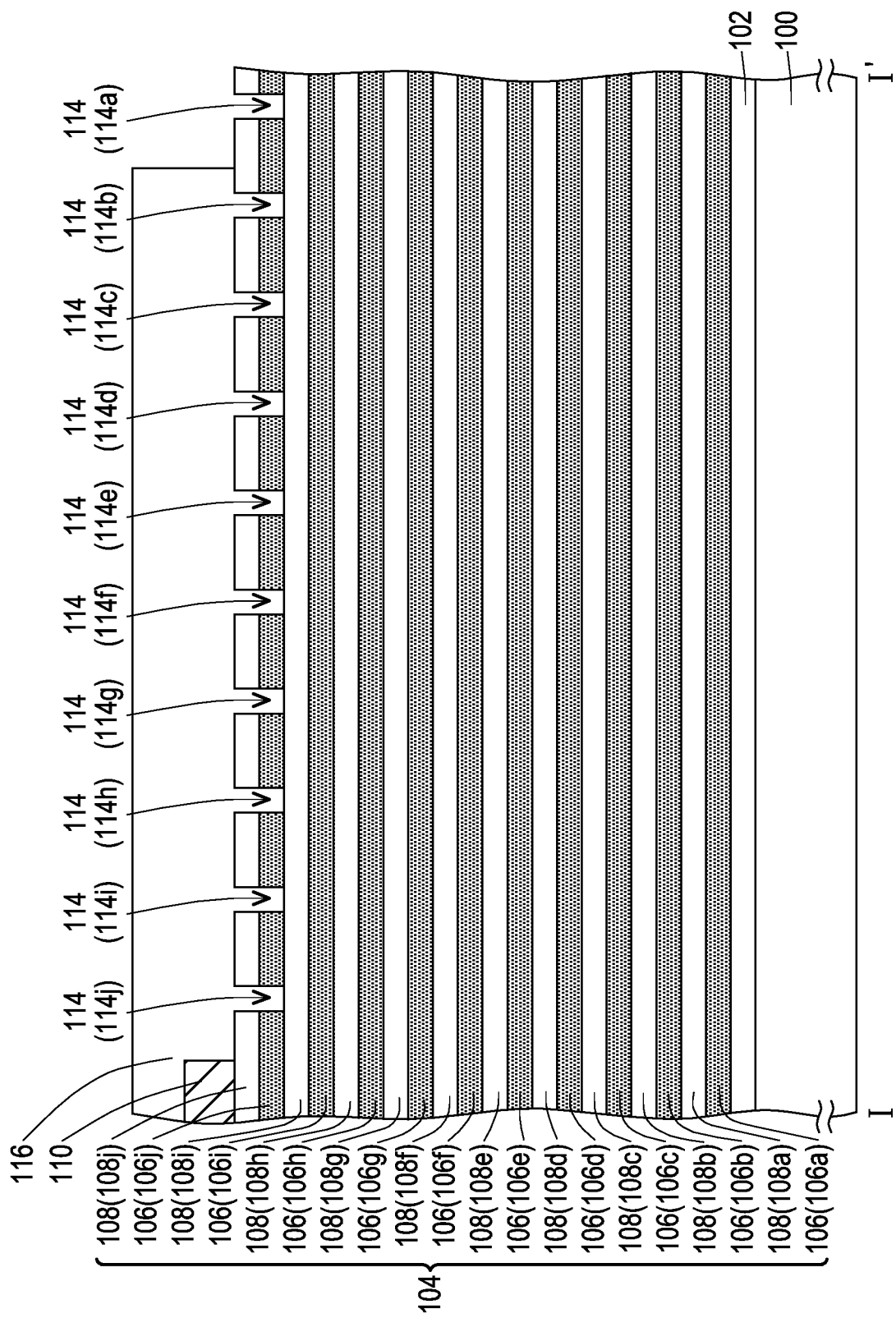
Figure 1F:
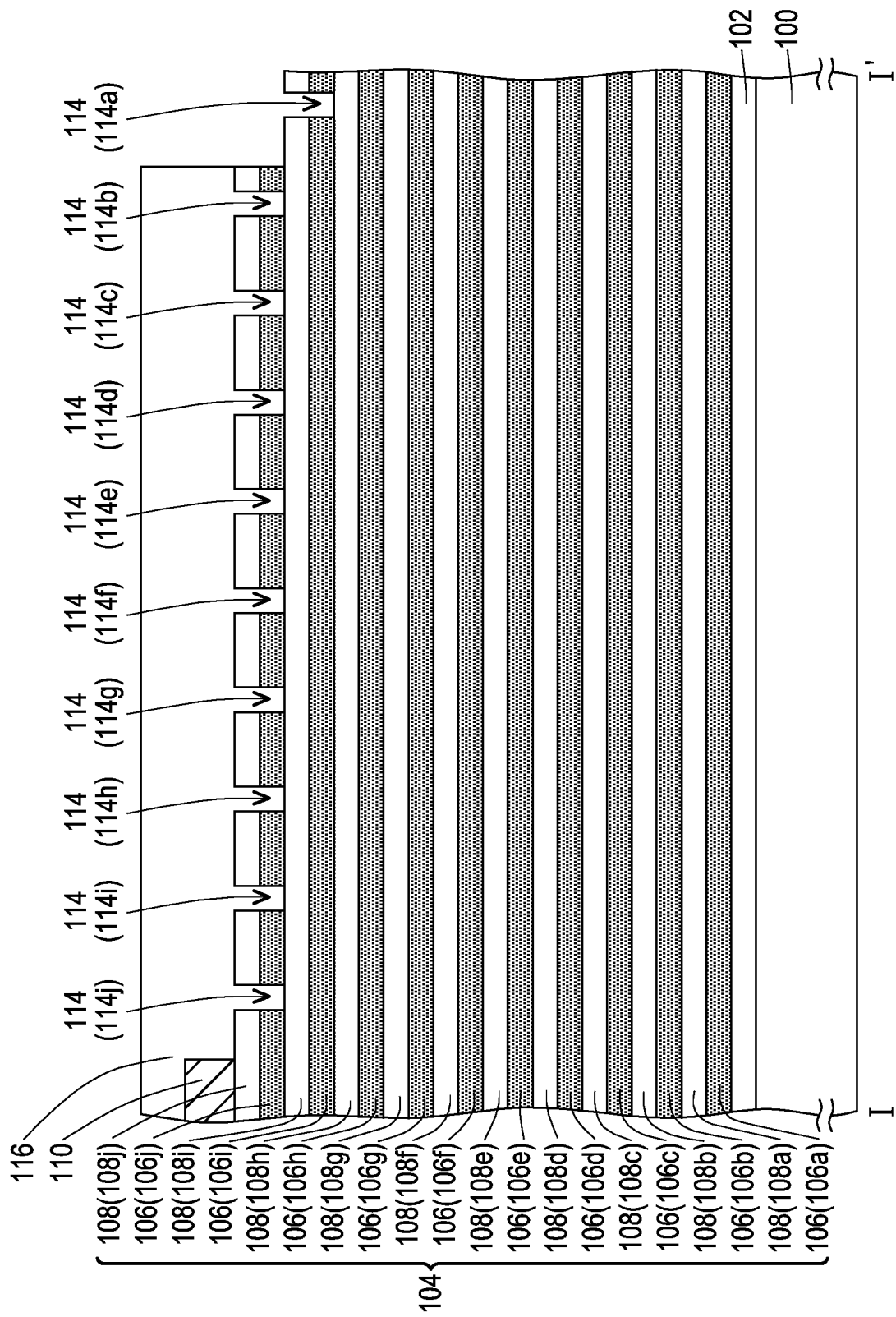
Figure 1G:
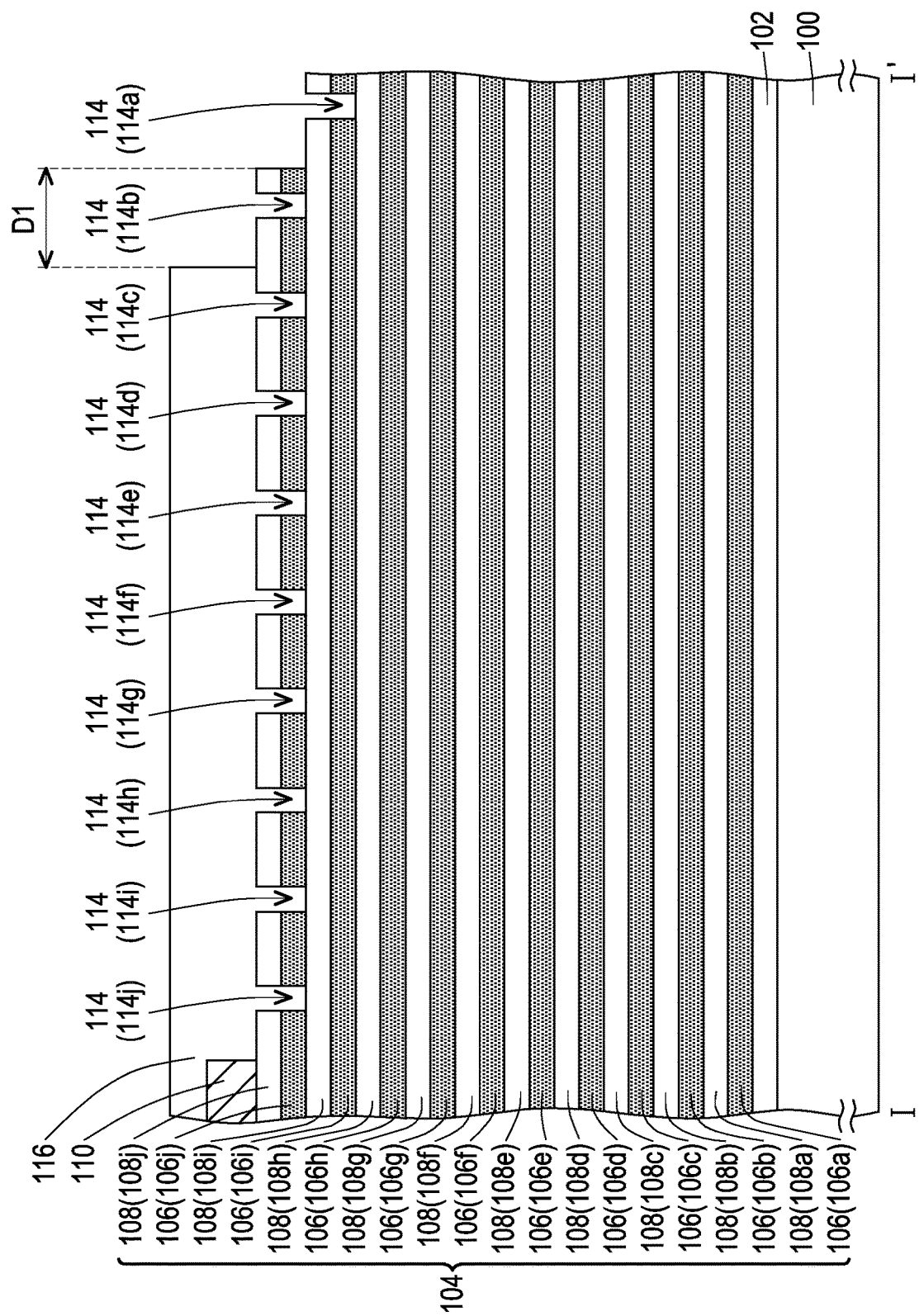
Figure 1H:
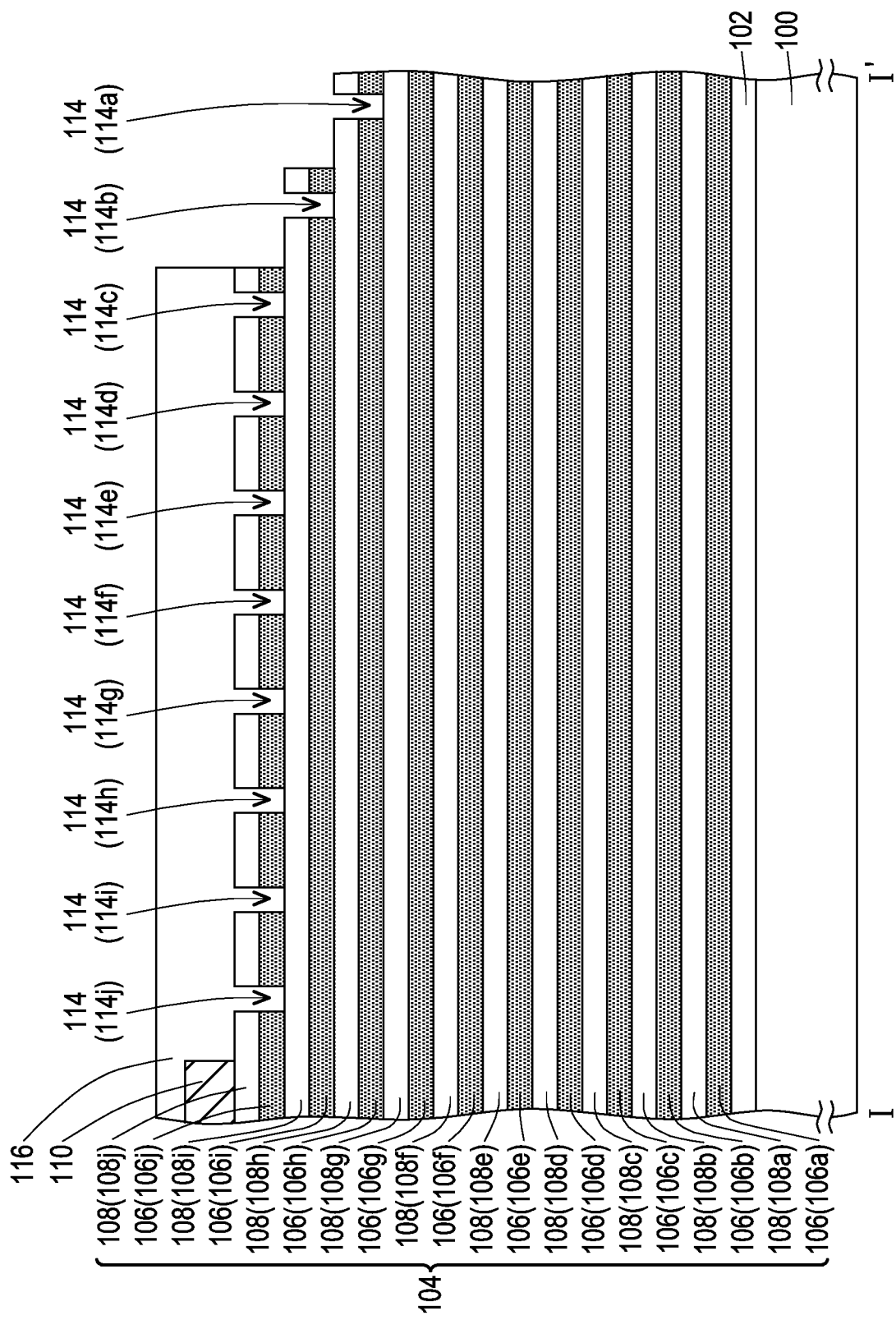
Figure 1I:
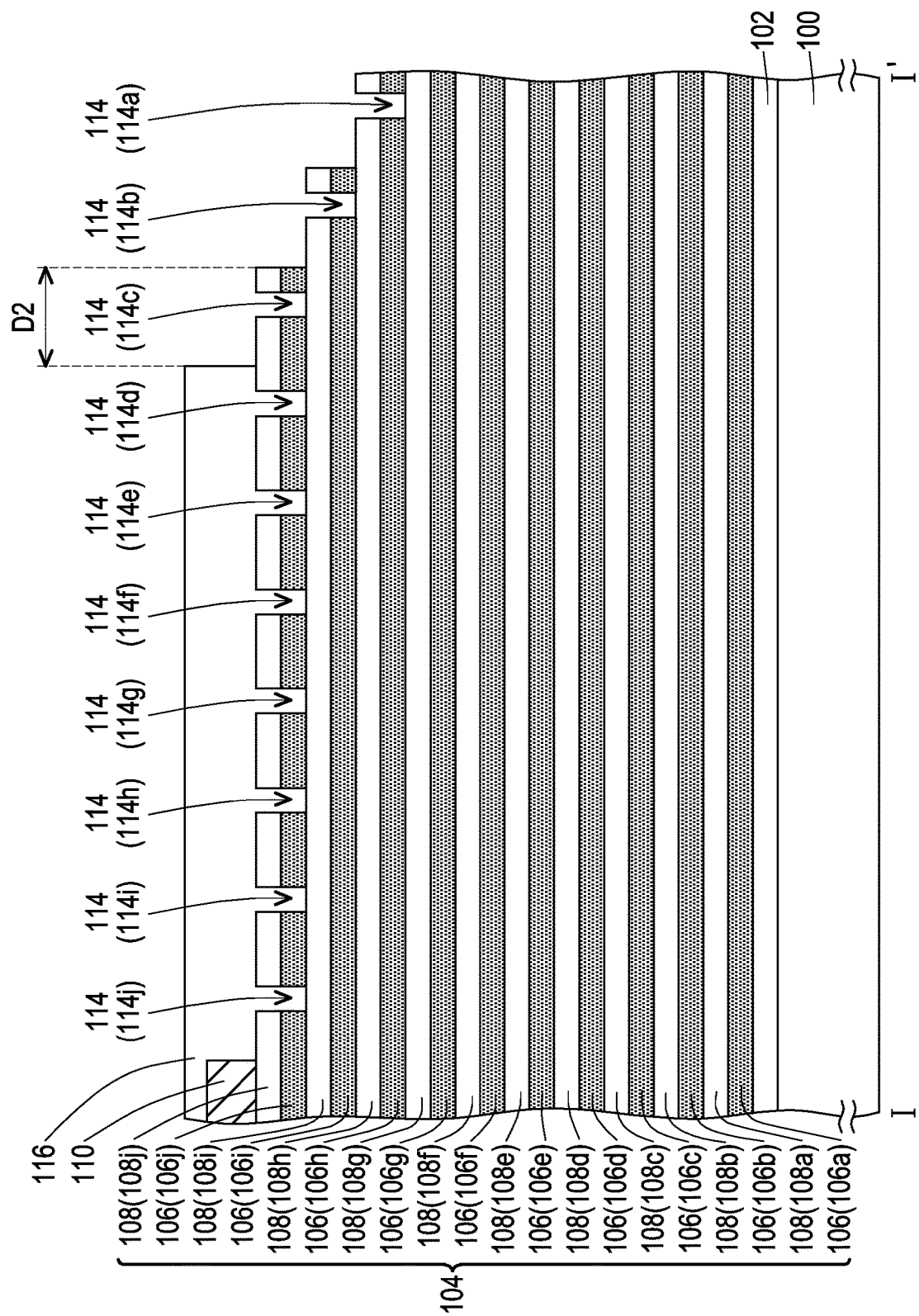
Figure 1J:
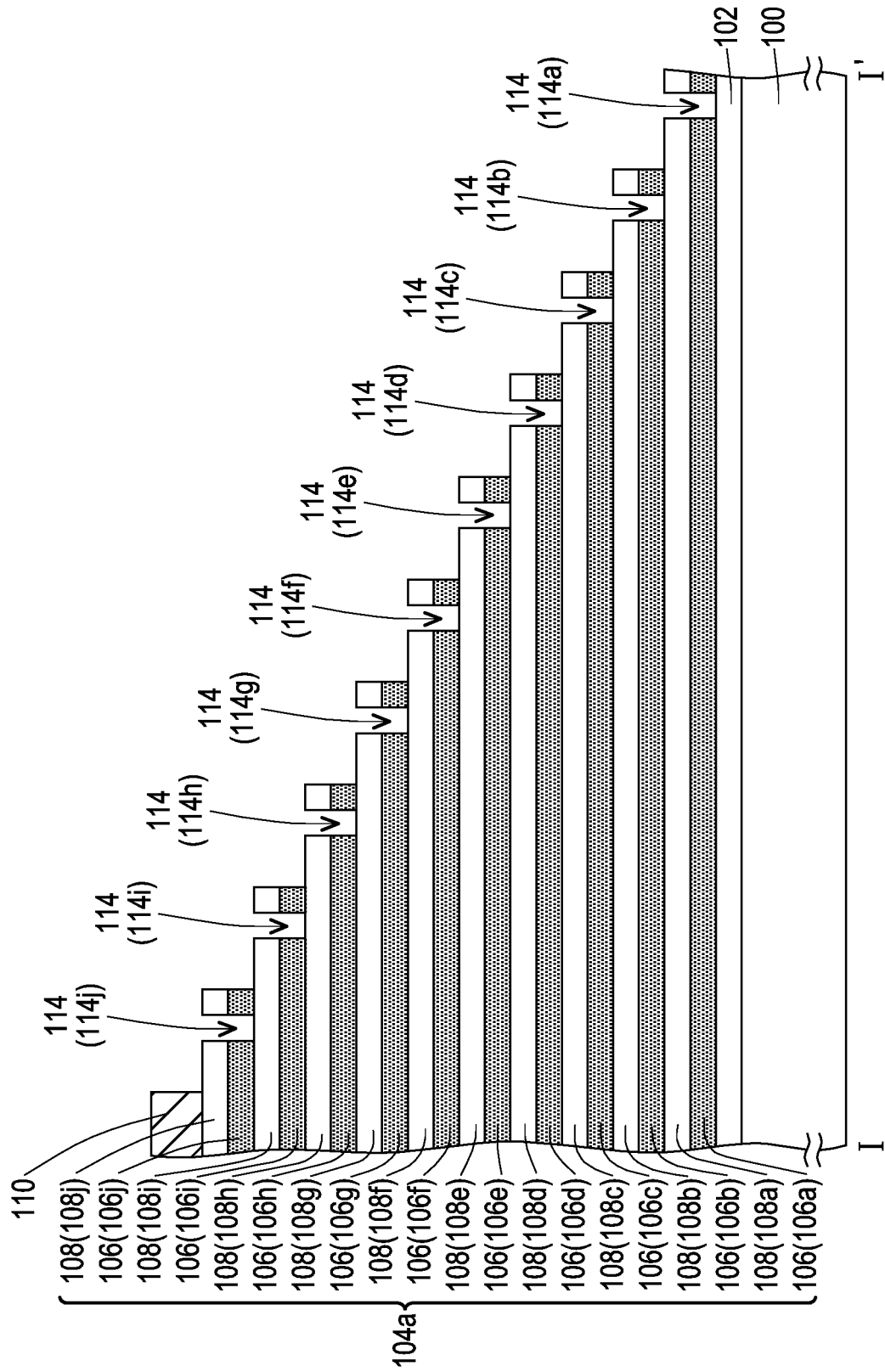
Figure 1K:
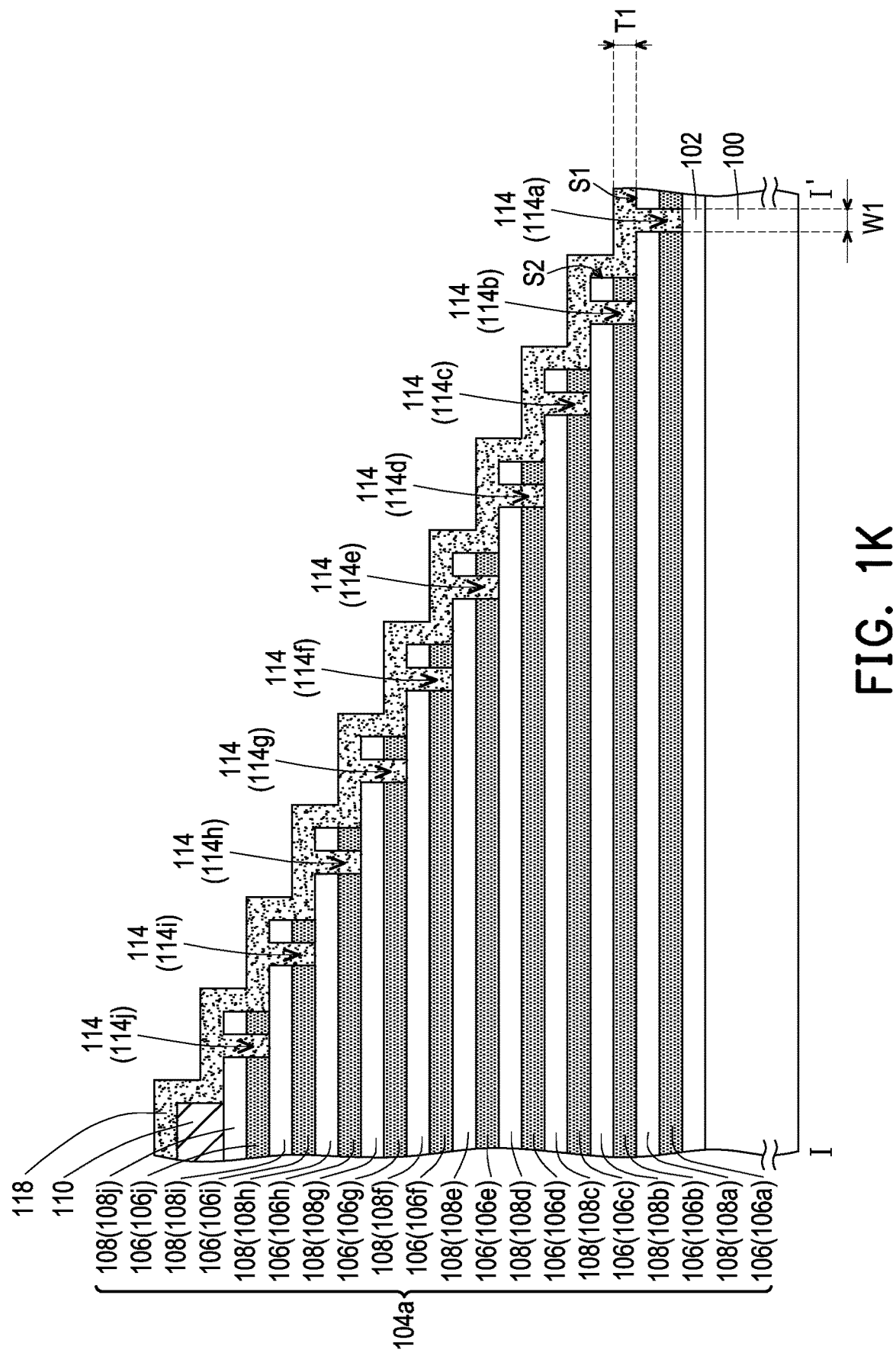
Figure 1L:
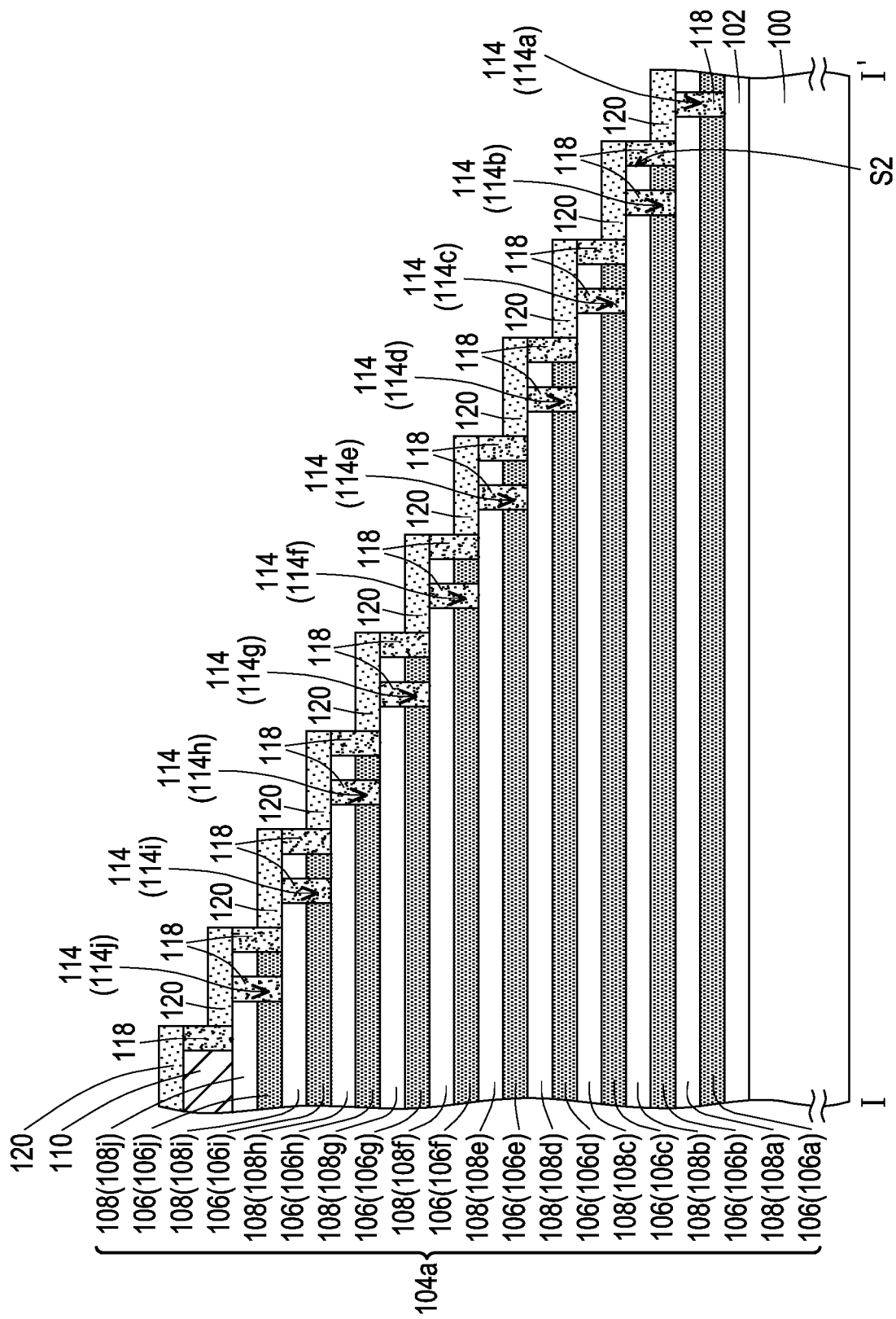
Figure 1M:
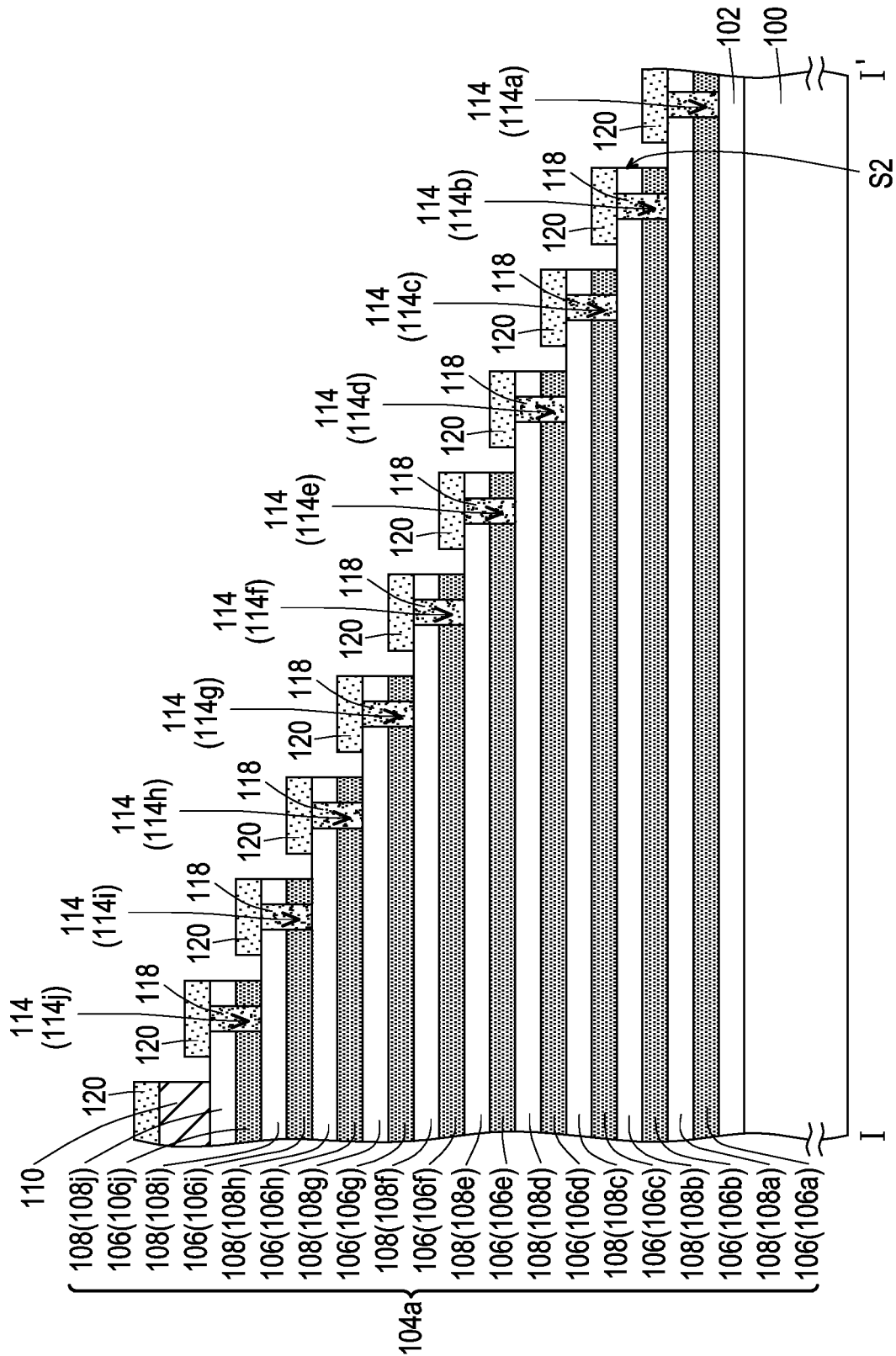
Figure 1N:
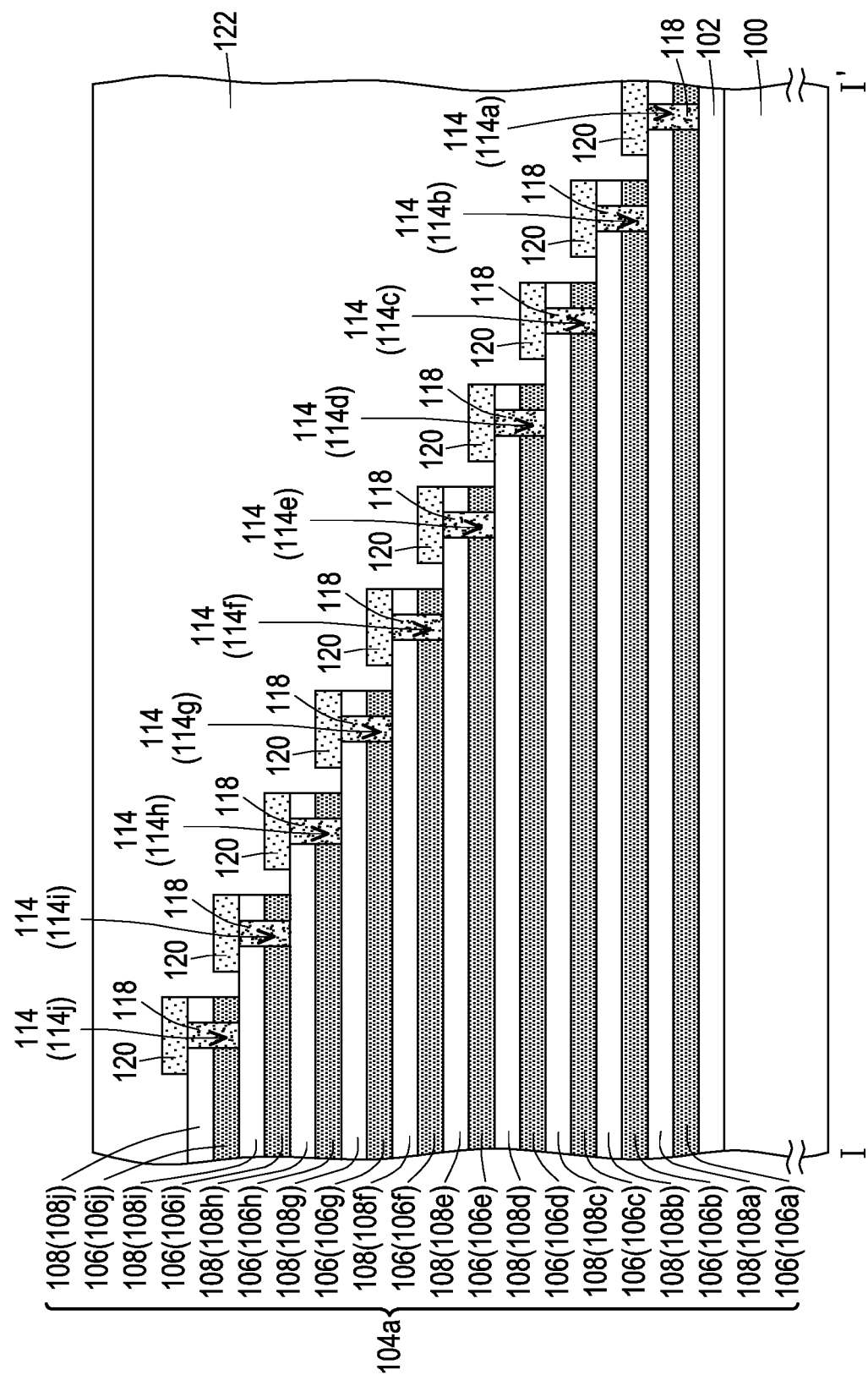
Figure 10:
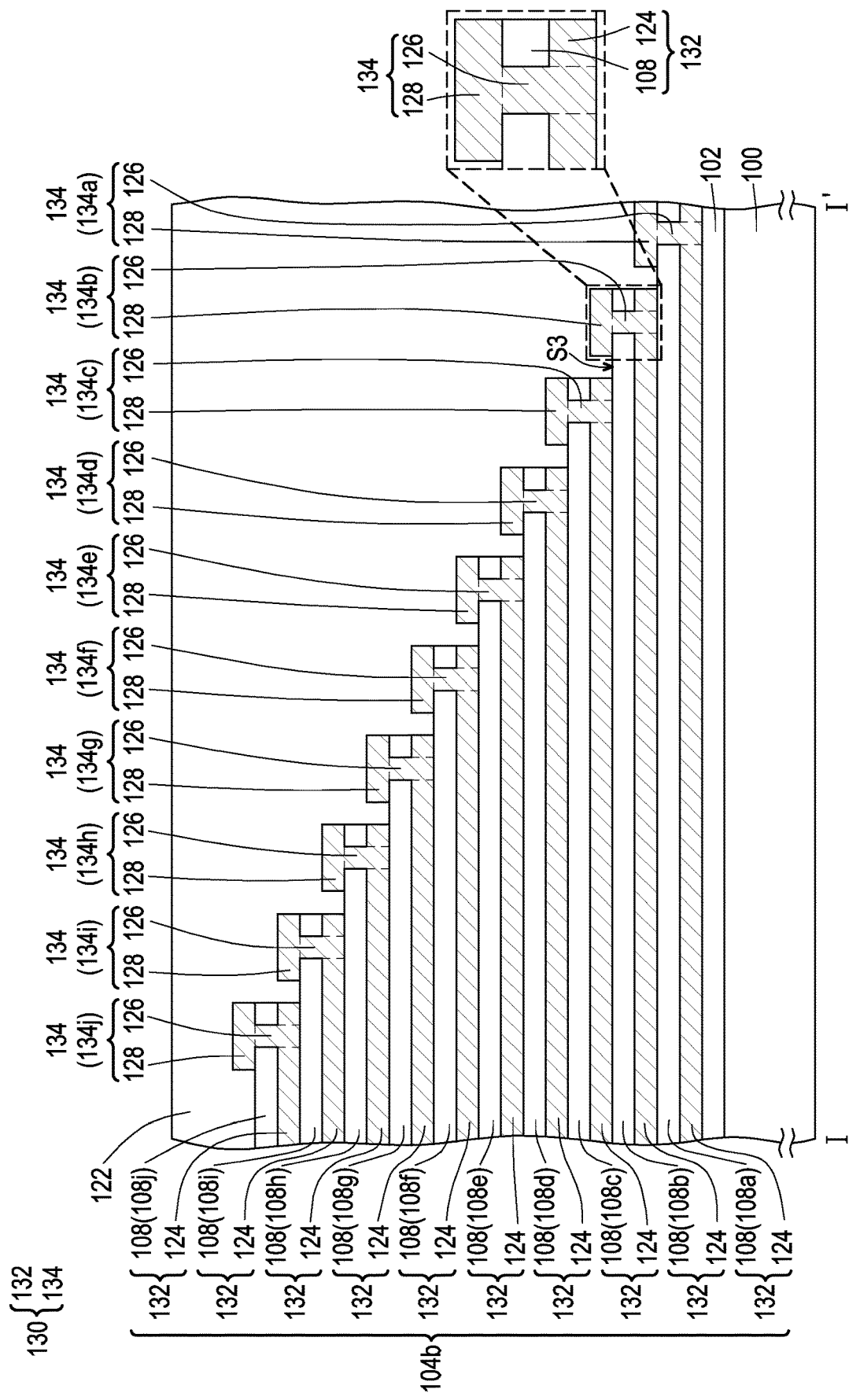
Figure 1P:
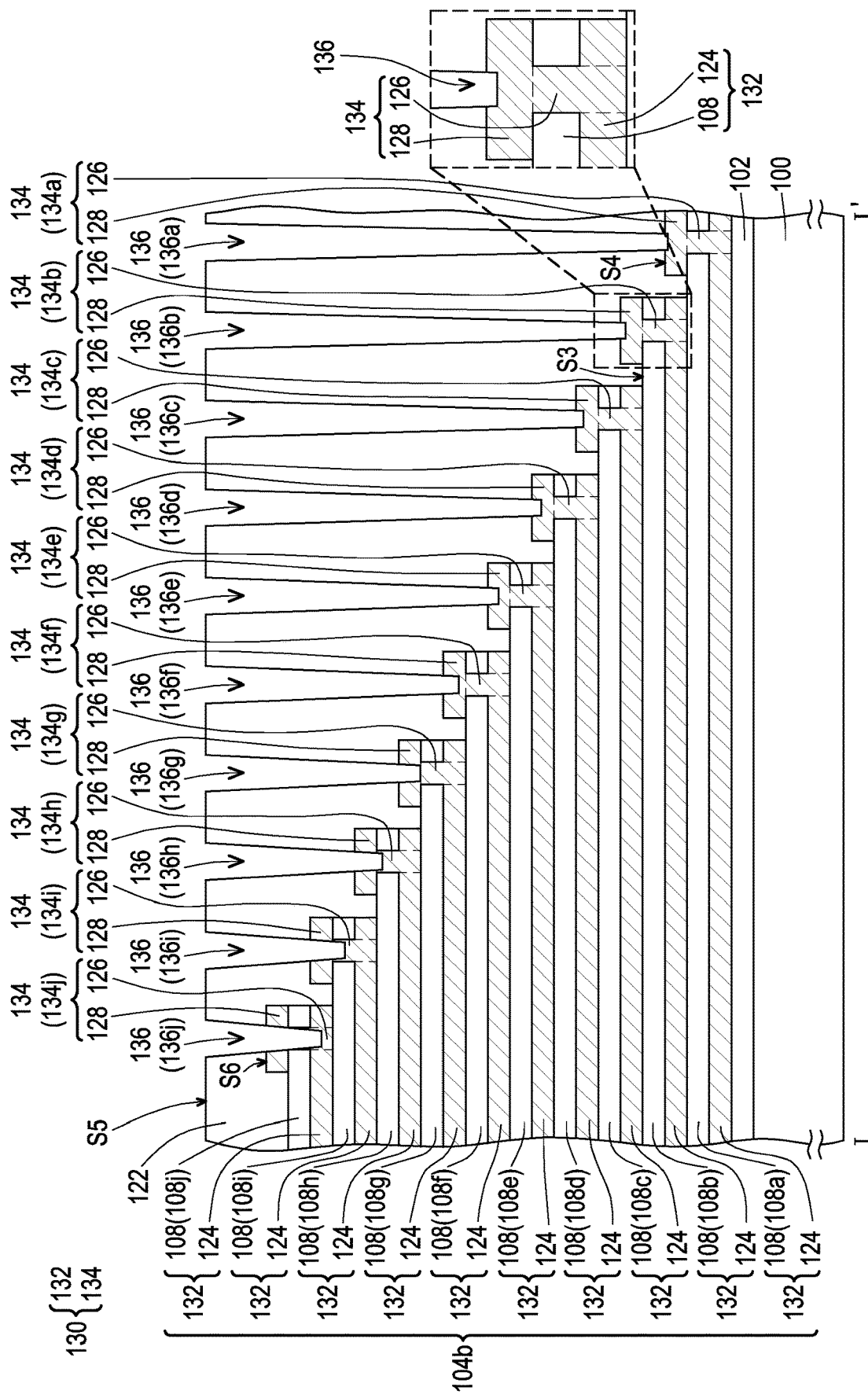
Figure 1Q:
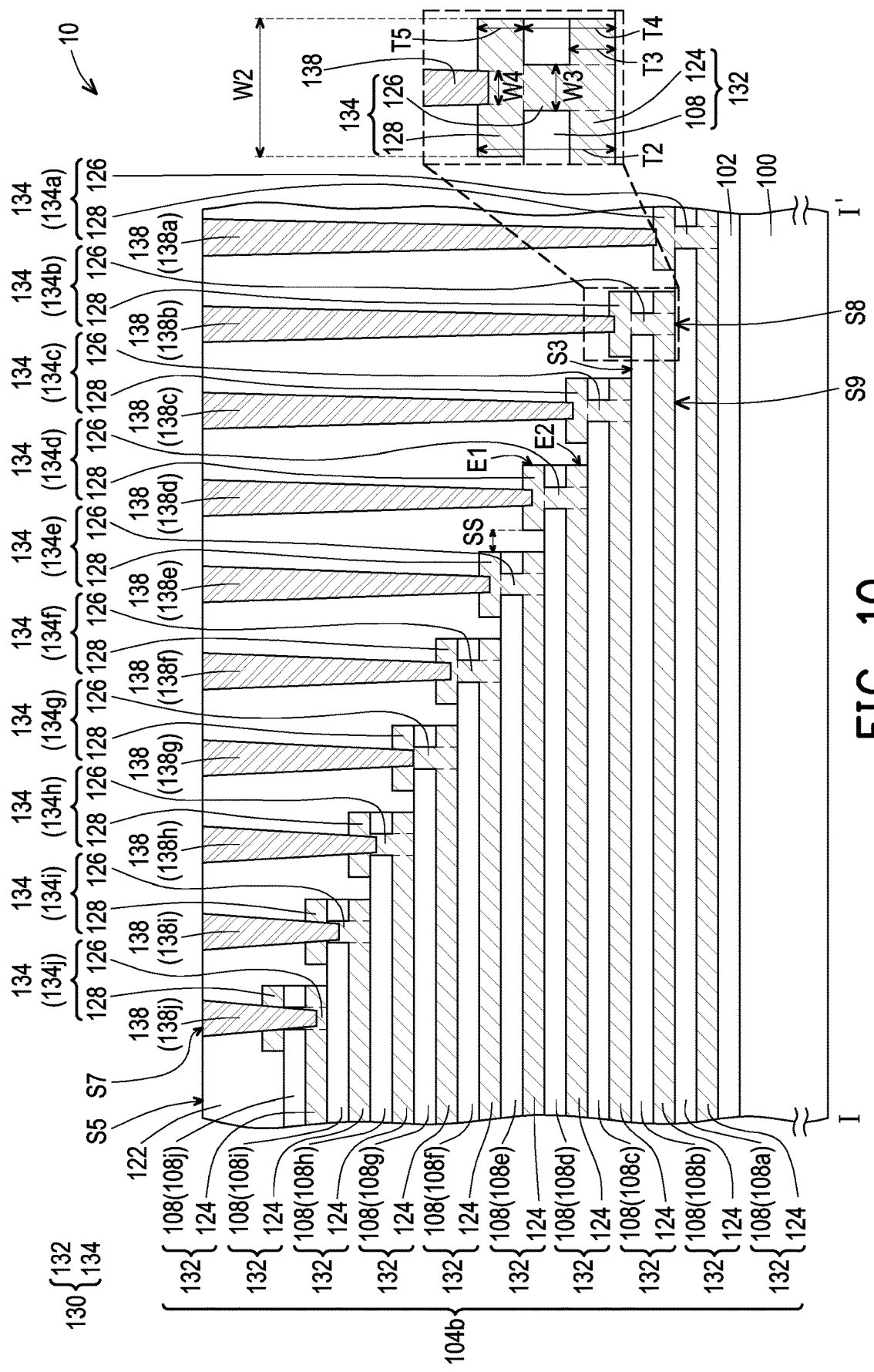
Figure 1R:
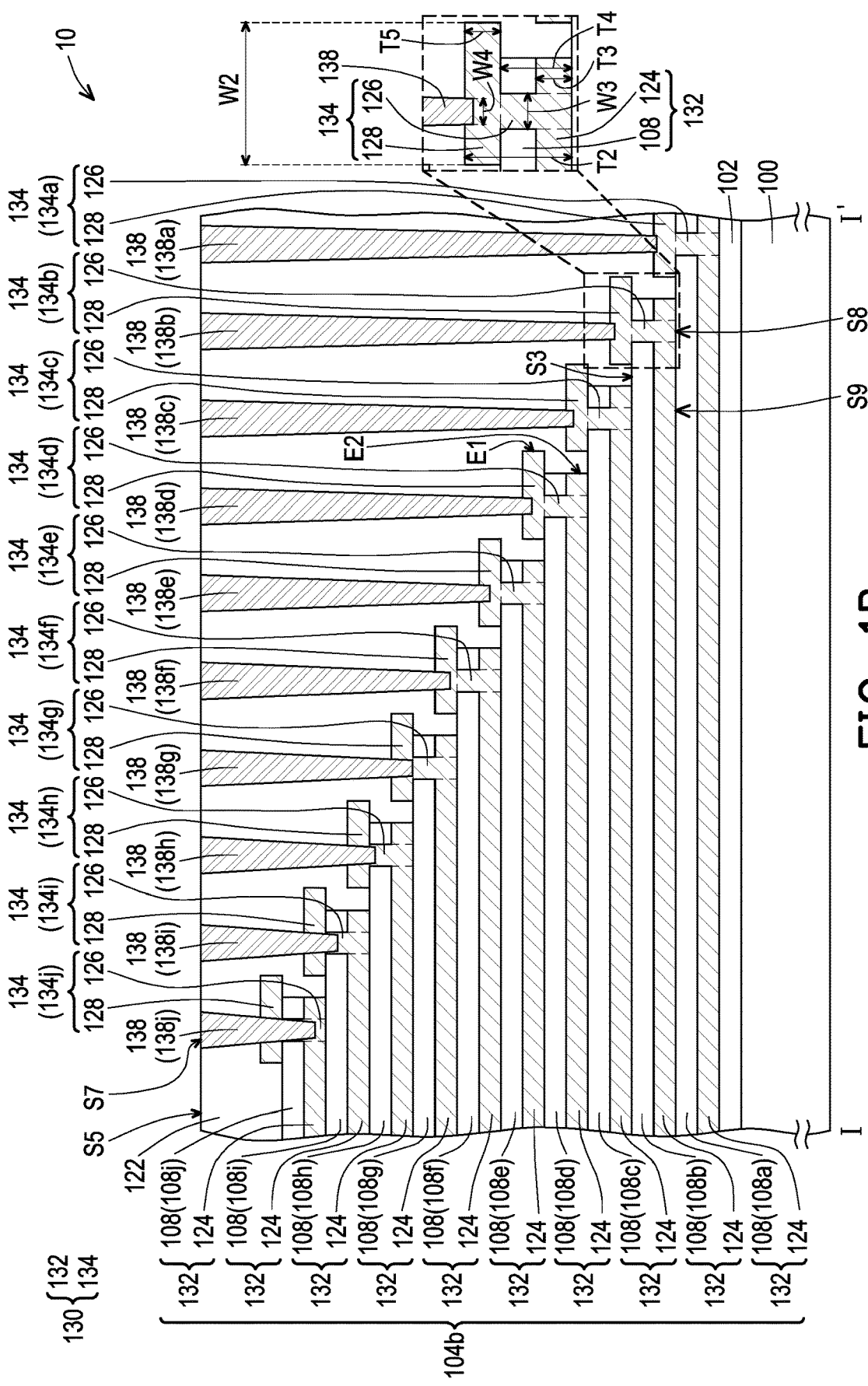
Figure 2B:
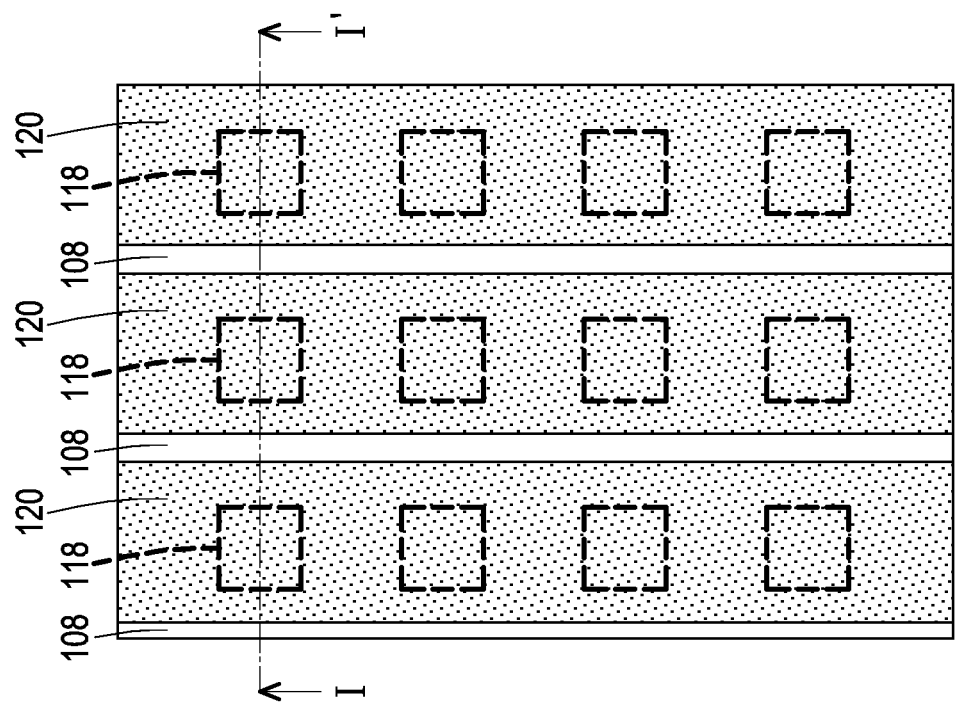
FIG. 2A to FIG. 2C are top views illustrating some stages of a manufacturing process of a semiconductor structure according to some embodiments of the invention.
Figure 2A:
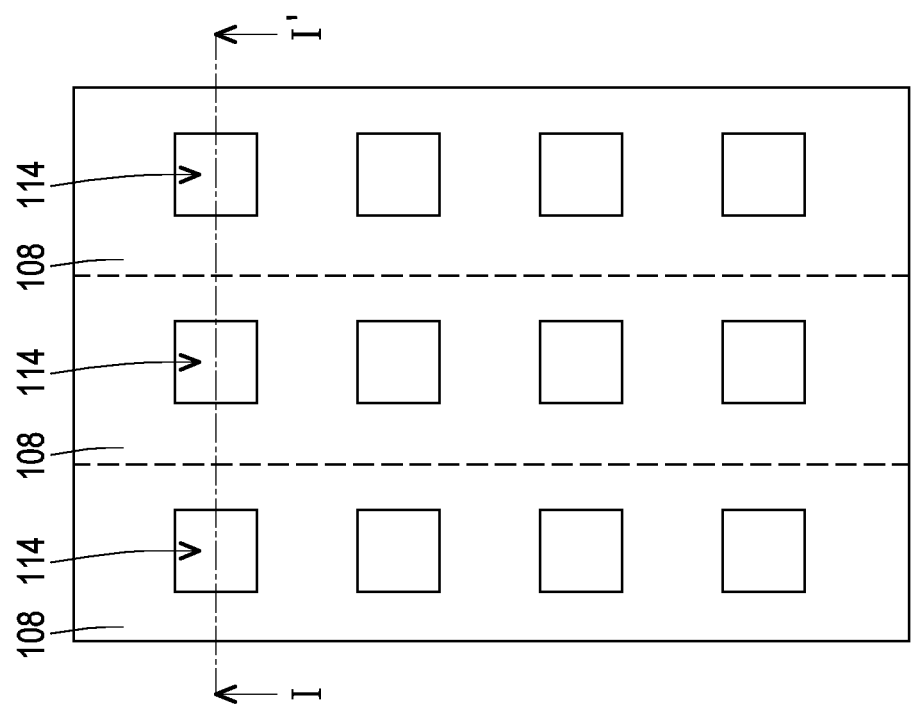
Figure 2C:
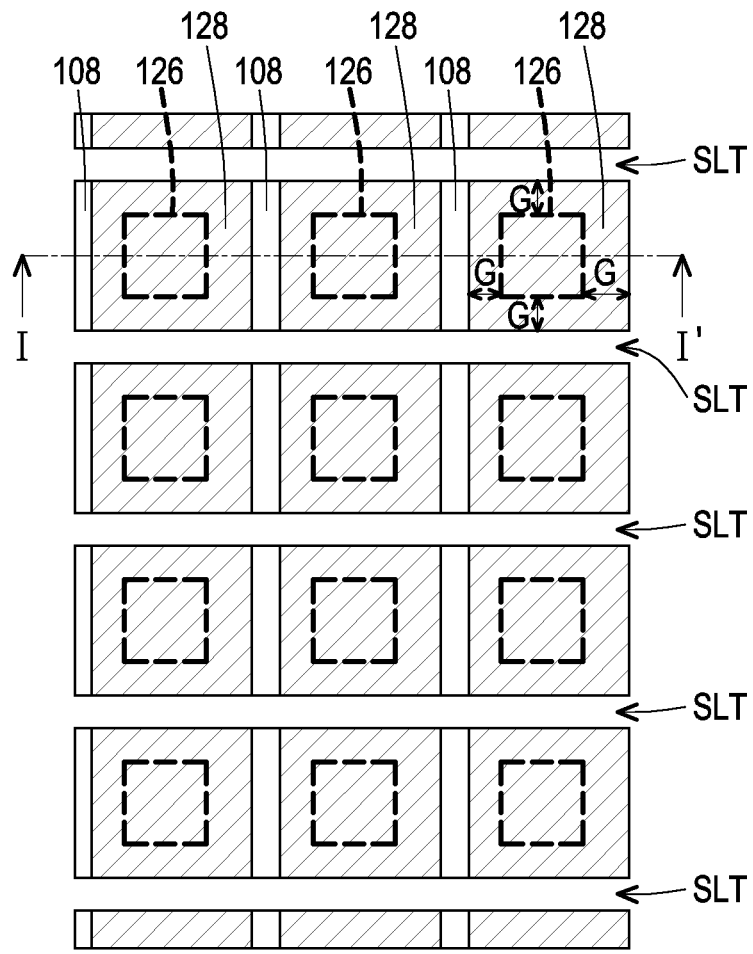
Figure 3B:
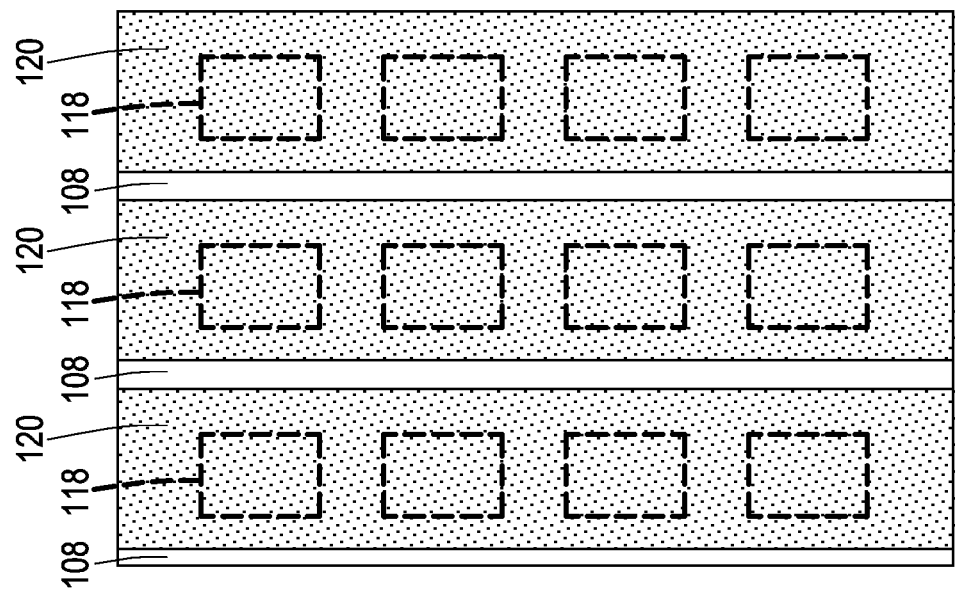
FIG. 3A to FIG. 3C are top views illustrating some stages of a manufacturing process of a semiconductor structure according to other embodiments of the invention.
Figure 3A:
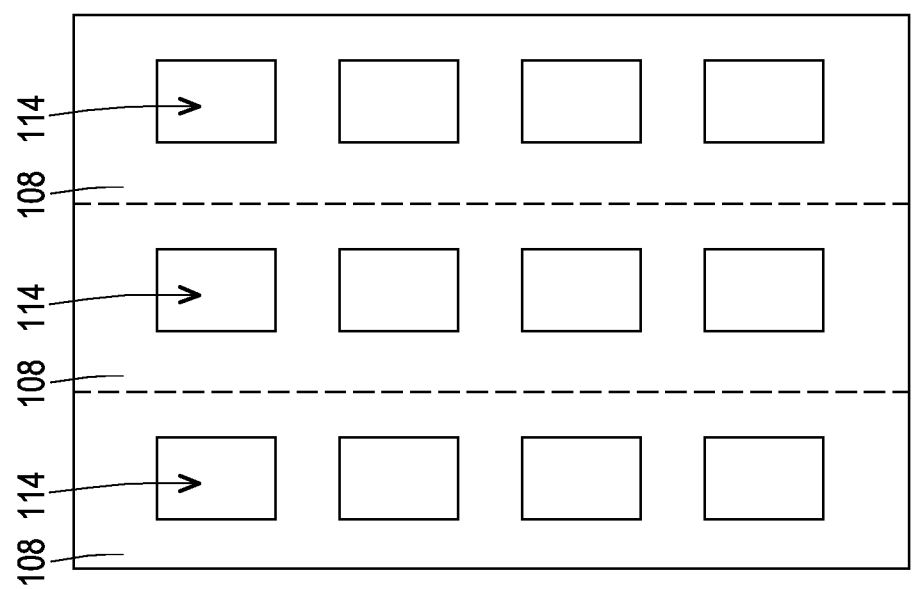
Figure 3C:
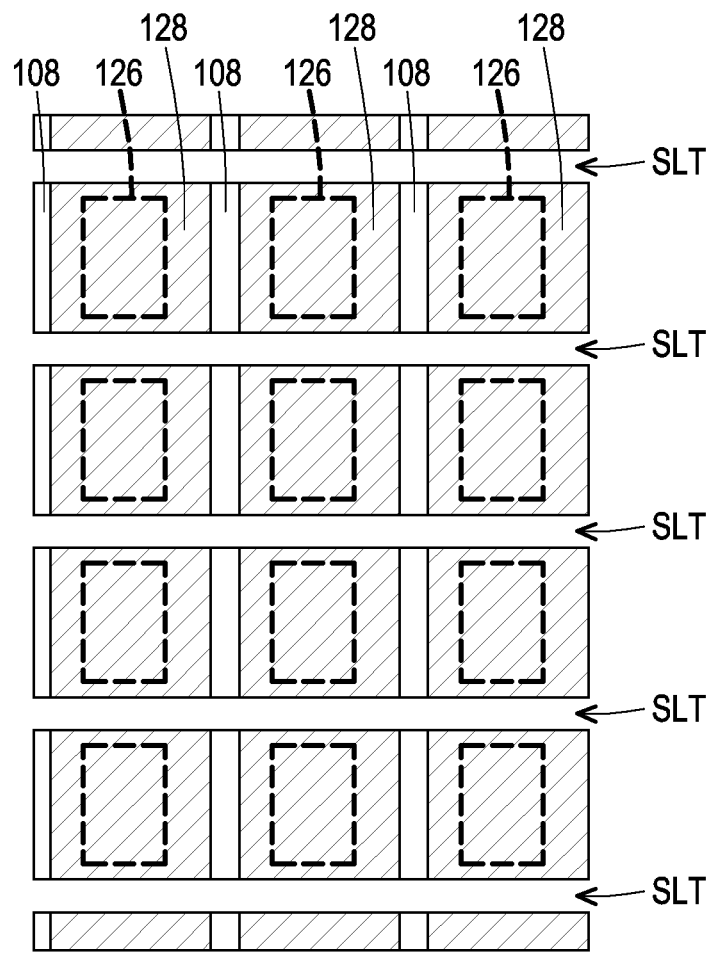
Figure 4B:
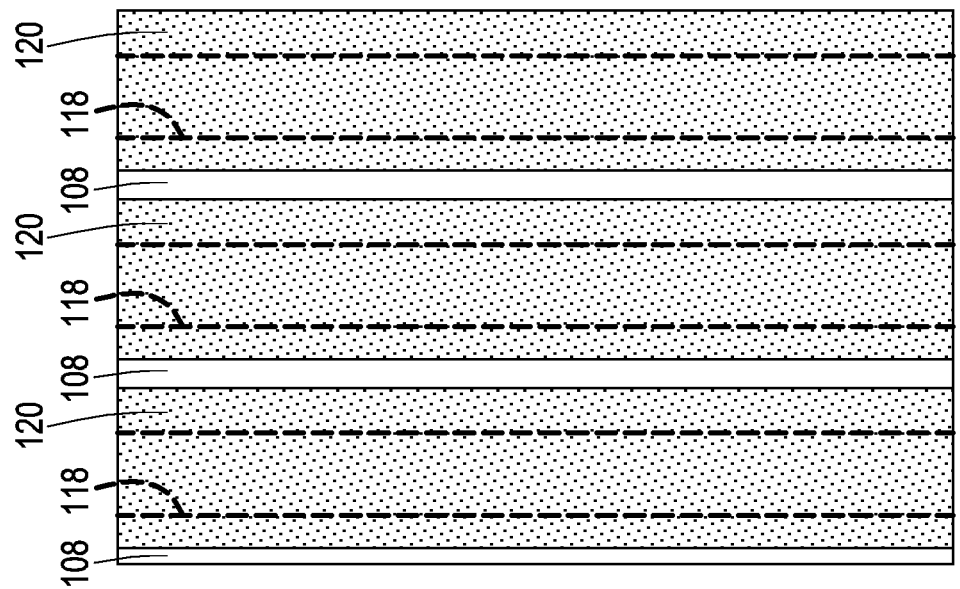
FIG. 4A to FIG. 4C are top views illustrating some stages of a manufacturing process of a semiconductor structure according to other embodiments of the invention.
Figure 4A:
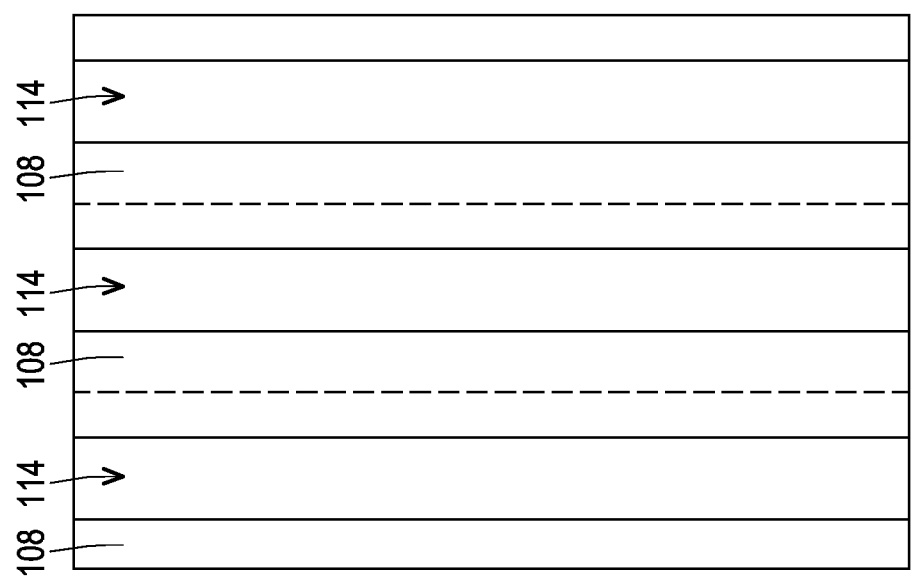
Figure 4C:
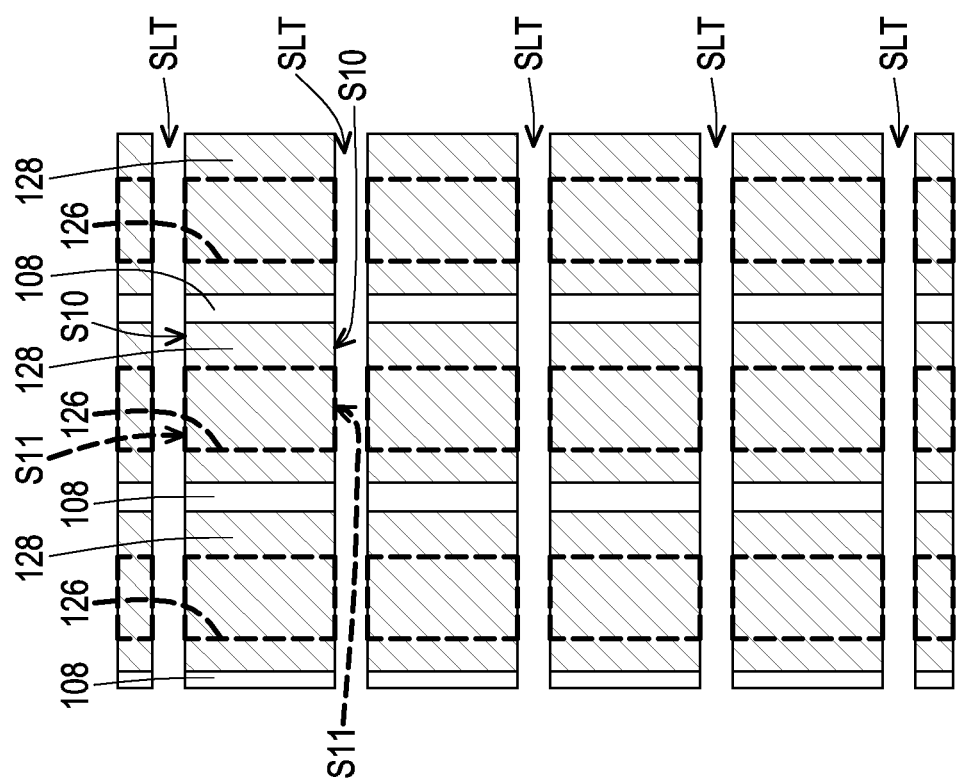

FIG. 1A to FIG. 1Q are cross-sectional views illustrating a manufacturing process of a semiconductor structure according to some embodiments of the invention. FIG. 1R is cross-sectional view illustrating a semiconductor structure according to other embodiments of the invention. FIG. 2A to FIG. 2C are top views illustrating some stages of a manufacturing process of a semiconductor structure according to some embodiments of the invention. FIG. 1A to FIG. 1R are cross-sectional views taken along section line I-I' in FIG. 2A to FIG. 2C. FIG. 3A to FIG. 3C are top views illustrating some stages of a manufacturing process of a semiconductor structure according to other embodiments of the invention. FIG. 4A to FIG. 4C are top views illustrating some stages of a manufacturing process of a semiconductor structure according to other embodiments of the invention. In the top view of the present embodiment, some components in the cross-sectional view are omitted to clearly illustrate the configuration relationship between the components in the top view.

Referring to FIG. 1A, a substrate 100 is provided. In some embodiments, the substrate 100 may be a semiconductor substrate (e.g., silicon substrate), a compound semiconductor substrate (e.g., gallium arsenide substrate), or a semiconductor-on-insulator (SOI) substrate, but the invention is not limited thereto. In addition, although not shown in FIG. 1A, the substrate 100 may have required components thereon, such as semiconductor devices (e.g., active devices and/or passive devices), interconnect structures and/or dielectric layers, and the description thereof is omitted here.

A protection layer 102 may be formed on the substrate 100. In some embodiments, the material of the protection layer 102 is, for example, silicon oxide. In some embodiments, the method of forming the protection layer 102 is, for example, a chemical vapor deposition (CVD) method.

A stack structure 104 may be formed on substrate 100. In some embodiments, the stack structure 104 may be formed on the protection layer 102. The stack structure 104 includes sacrificial layers 106 (e.g., sacrificial layers 106a-106j) and dielectric layers 108 (e.g., dielectric layers 108a-108j) alternately stacked. In some embodiments, the material of the sacrificial layer 106 is, for example, silicon nitride. In some embodiments, the method of forming the sacrificial layer 106 is, for example, a CVD method. In some embodiments, the material of the dielectric layer 108 is, for example, silicon oxide. In some embodiments, the method of forming the dielectric layer 108 is, for example, a CVD method.

A stop layer 110 may be formed on the stack structure 104. In some embodiments, the material of the stop layer 110 is, for example, polysilicon. In some embodiments, the method of forming the stop layer 110 is, for example, a CVD method.

Referring to FIG. 1B, the stop layer 110 may be patterned to expose the stack structure 104. For example, the stop layer 110 may expose the dielectric layer 108j of the stack structure 104. In some embodiments, the stop layer 110 may be patterned by a lithography process and an etching process.

Referring to FIG. 1C, a patterned photoresist layer 112 may be formed on the stack structure 104 and the stop layer 110. In some embodiments, the patterned photoresist layer 112 may be formed by a lithography process.

Referring to FIG. 1D, a portion of the dielectric layer 108j and a portion of the sacrificial layer 106j are removed by using the patterned photoresist layer 112 as a mask to form openings 114 (e.g., openings 114a-114j) in the dielectric layer 108j and the sacrificial layer 106j. In some embodiments, the method of removing a portion of the dielectric layer 108j and a portion of the sacrificial layer 106j is, for example, a dry etching method.

The patterned photoresist layer 112 may be removed. In some embodiments, the method of removing the patterned photoresist layer 112 is, for example, a dry stripping method or a wet stripping method.

Referring to FIG. 1E, a patterned photoresist layer 116 may be formed on the stack structure 104 and the stop layer 110. The patterned photoresist layer 116 may expose the opening 114a and a portion of the stack structure 104. In some embodiments, the patterned photoresist layer 116 may be formed by a lithography process.

Referring to FIG. 1F, an etching process is performed by using the patterned photoresist layer 116 as a mask to remove a portion of the dielectric layer 108*j* and a portion of the sacrificial layer 106*j* exposed by the patterned photoresist layer 116 and a portion of the dielectric layer 108*i* and a portion of the sacrificial layer 106*i* located below the opening 114*a*, so as to transfer the pattern of the opening 114*a* into the dielectric layer 108*i* and the sacrificial layer 106*i*. Therefore, the opening 114*a* transferred into the dielectric layer 108*i* and the sacrificial layer 106*i* may expose the dielectric layer 108*h*. In addition, in this step, the patterned photoresist layer 116 may be etched, so that the thickness of the patterned photoresist layer 116 may be reduced. In some embodiments, the etching process may be a dry etching process such as a reactive ion etching (RIE) process.

Referring to FIG. 1G, a trimming process may be performed on the patterned photoresist layer 116 to expose the opening 114*b*. The trimming process refers to a process of pulling back the patterned photoresist layer 116 by a distance D1. In this way, as shown in FIG. 1G, the patterned photoresist layer 116 may expose the opening 114*a* and the opening 114*b*. In some embodiments, the thickness of the patterned photoresist layer 116 is reduced when the patterned photoresist layer 116 is trimmed and pulled back. In some embodiments, the trimming process may be performed by a dry etching process.

Referring to FIG. 1H, an etching process is performed by using the patterned photoresist layer 116 as a mask to remove a portion of the dielectric layer 108*j*, a portion of the sacrificial layer 106*j*, a portion of the dielectric layer 108*i*, a portion of the sacrificial layer 106*i*, a portion of the dielectric layer 108*h*, and a portion of the sacrificial layer 106*h*, so as to transfer the pattern of the opening 114*a* into the dielectric layer 108*h* and the sacrificial layer 106*h* and to transfer the pattern of the opening 114*b* into the dielectric layer 108*i* and the sacrificial layer 106*i*. Therefore, the opening 114*a* transferred into the dielectric layer 108*h* and the sacrificial layer 106*h* may expose the dielectric layer 108*g*, and the opening 114*b* transferred into the dielectric layer 108*i* and the sacrificial layer 106*i* may expose the dielectric layer 108*h*. In addition, in this step, the patterned photoresist layer 116 may be etched, so that the thickness of the patterned photoresist layer 116 may be reduced. In some embodiments, the etching process may be a dry etching process such as a reactive ion etching (RIE) process.

Referring to FIG. 1I, a trimming process may be performed on the patterned photoresist layer 116 to expose the opening 114*c*. The trimming process may pull back the patterned photoresist layer 116 by a distance D2. In this way, as shown in FIG. 1I, the patterned photoresist layer 116 may expose the opening 114*a*, the opening 114*b*, and the opening 114*c*. In some embodiments, the thickness of the patterned photoresist layer 116 is reduced when the patterned photoresist layer 116 is trimmed and pulled back. In some embodiments, the trimming process may be performed by a dry etching process.

Referring to FIG. 1J, the etching process and the trimming process may be repeated until the stair step structure 104*a* shown in FIG. 1J is formed. By the above method, the stack structure 104 may be patterned to form a stair step structure 104*a* and to form the opening 114 in each of stair steps of the stair step structure 104*a*. In some embodiments, the opening 114 may pass through one dielectric layer 108 and one sacrificial layer 106.

Furthermore, after forming the stair step structure 104*a*, the patterned photoresist layer may be removed. In some embodiments, the method of removing the patterned photoresist layer 116 is, for example, a dry stripping method or a wet stripping method.

In some embodiments, the top-view pattern of the opening 114 may be a polygon, a circle, or an ellipse. Referring to FIG. 1J and FIG. 2A, the top-view pattern of the opening 114 may be a square shape, but the invention is not limited thereto. In other embodiments, as shown in FIG. 3A and FIG. 4A, the top-view pattern of the opening 114 may be a rectangle shape (FIG. 3A) or a bar shape (FIG. 4A).

Referring to FIG. 1K, a sacrificial layer 118 may be conformally formed on the upper surfaces S1 and the side surfaces S2 of the stair step structure 104*a* and in the openings 114. In some embodiments, the sacrificial layer 118 may be further conformally formed on stop layer 110. In some embodiments, the thickness T1 of the sacrificial layer 118 may be greater than or equal to half of the width W1 of the opening 114. In some embodiments, the material of the sacrificial layer 118 is, for example, silicon nitride. In some embodiments, the method of forming the sacrificial layer 118 is, for example, a CVD method.

Referring to FIG. 1L, a surface hardening treatment may be performed on the sacrificial layer 118 to form sacrificial layers 120. The sacrificial layers 120 cover the sacrificial layer 118 located in the openings 114 and expose the sacrificial layer 118 located on the side surfaces S2 of the stair step structure 104*a*. In some embodiments, the sacrificial layer may cover the stop layer 110. In some embodiments, the surface hardening treatment may be an argon (Ar) plasma treatment.

Referring to FIG. 1M, the sacrificial layer 118 located on the side surfaces S2 of the stair step structure 104*a* may be removed. In some embodiments, in the step of removing the sacrificial layer 118 located on the side surfaces S2 of the stair step structure 104*a*, a portion of the sacrificial layer 120 may be removed, but the invention is not limited thereto. In some embodiments, the method of removing the sacrificial layer 118 located on the side surfaces S2 of the stair step structure 104*a* is, for example, a wet etching method. For example, the sacrificial layer 118 located on the side surfaces S2 of the stair step structure 104*a* may be removed by hot phosphoric acid.

Referring to FIG. 1N, a dielectric layer 122 may be formed on the stair step structure 104*a* and the sacrificial layers 120. The dielectric layer 122 may be a single-layer structure or a multilayer structure. In some embodiments, the material of the dielectric layer 122 is, for example, silicon oxide. In some embodiments, the method for forming the dielectric layer 122 is, for example, a CVD method. In some embodiments, during the formation of the dielectric layer 122, the stop layer 110 and the sacrificial layer 120 located on the stop layer 110 may be removed.

In some embodiments, the top-view pattern of the sacrificial layer 118 located in the opening 114 may be a polygon, a circle, or an ellipse. Referring to FIG. 1N and FIG. 2B, the top-view pattern of the sacrificial layer 118 located in the opening 114 may be a square shape, but the invention is not limited thereto. In other embodiments, as shown in FIG. 3B and FIG. 4B, the top-view pattern of the sacrificial layer 118 located in the opening 114 may be a rectangle shape (FIG. 3B) or a bar shape (FIG. 4B). In addition, referring to FIG. 2B, FIG. 3B, and FIG. 4B, the top-view pattern of the sacrificial layer 120 may be a bar shape.

Referring to FIG. 1O and FIG. 2C, a replacement process may be performed to replace the sacrificial layer 106, the sacrificial layer 118, and the sacrificial layer 120 with a conductive layer 124, a conductive pillar 126, and a pad layer 128, respectively. For example, the replacement process may include the following steps. First, slits SLT (FIG. 2C) may be formed in the dielectric layer 122 and the stair step structure 104a. Although the cross-sectional view of FIG. 1O does not show the slits SLT, it can be learned from FIG. 2C that the extension direction of the slit SLT may be parallel to the direction of the section line I-I'. The slits SLT may extend to the bottom surface of the stair step structure 104a, so as to expose a cross-section of the sacrificial layer 106 and a cross-section of the sacrificial layer 120. Then, the sacrificial layer 106, the sacrificial layer 118, and the sacrificial layer 120 may be removed to form gaps (not shown). In some embodiments, the method of removing the sacrificial layer 106, the sacrificial layer 118, and the sacrificial layer 120 is, for example, a wet etching method. For example, an etchant may be applied in the slits SLT to remove the sacrificial layer 106, the sacrificial layer 118, and the sacrificial layer 120. In some embodiments, the etchant is, for example, hot phosphoric acid. Next, a deposition process is performed to form a conductive material layer (not shown) in the gaps and the slits SLT. The conductive material layer may have a single-layer structure or a multi-layer structure. In some embodiments, the material of the conductive material layer is, for example, tungsten, titanium, titanium nitride, or a combination thereof, but the invention is not limited thereto. Then, the conductive material layer in the slits SLT may be removed by an etch-back process to form the conductive layer 124, the conductive pillar 126, and the pad layer 128.

In this way, as shown in FIG. 1O, after the replacement process is performed, the sacrificial layer 106 is replaced with the conductive layer 124, the sacrificial layer 118 is replaced with the conductive pillar 126, and the sacrificial layer 120 is replaced with the pad layer 128. In some embodiments, the conductive layer 124, the conductive pillar 126, and the pad layer 128 may be formed simultaneously by the same process. In some embodiments, the conductive layer 124, the conductive pillar 126, and the pad layer 128 may be integrally formed. In some embodiments, the materials of the conductive layer 124, the conductive pillar 126, and the pad layer 128 may be the same. Each of the conductive layer 124, the conductive pillar 126, and the pad layer 128 may be a single-layer structure or a multilayer structure. In some embodiments, the materials of the conductive layer 124, the conductive pillar 126, and the pad layer 128 are, for example, tungsten, titanium, titanium nitride, or a combination thereof, but the invention is not limited thereto.

By the above method, a pad structure 130 may be formed on the substrate 100. The pad structure 130 includes material pairs 132 and pads 134 (e.g., pads 134a-134j). The material pairs 132 are stacked on the substrate 100 to form a stair step structure 104b. Each of the material pair 132 includes a conductive layer 124 and a dielectric layer 108 located on the conductive layer 124. Each of the pads 134 includes a conductive pillar 126 and a pad layer 128. The conductive pillar 126 is embedded in the material pair 132 and is connected to the conductive layer 124 of the material pair 132. The pad layer 128 is located on the conductive pillar 126. The pad layer 128 may be located on the top surface S3 of the dielectric layer 108 of the material pair 132. In some embodiments, the protection layer 102 may be formed between the stair step structure 104b and the substrate 100.

Referring to FIG. 1P, contact openings 136 (e.g., contact openings 136a-136j) may be formed in the dielectric layer 122. The contact openings 136a to 136j expose the pads 134a to 134j, respectively. In some embodiments, the contact opening 136 may be formed by patterning the dielectric layer 122 by a lithography process and an etching process. In some embodiments, the pads 134a-134j may be used as etching stop layers during formation of the contact openings 136a-136j. Compared with the distance between the top surface S4 of the pad 134a and the top surface S5 of the dielectric layer 122, the distance between the top surface S6 of the pad 134j and the top surface S5 of the dielectric layer 122 is shorter. In this way, during the process of forming the contact openings 136, the contact opening 136j firstly touches the top surface S6 of the top pad 134j, so that the etching amount of the top pad 134j is greater than the etching amounts of other pads 134a-134i. Since the pad 134 of the above embodiments can have greater thickness, the electrical failure caused by over-etching during the process of manufacturing the contact opening 136 can be prevented. In addition, since the thicker pad 134 is used as the etching stop layer during formation of the contact opening 136, the process window of the contact opening 136 can be improved and the process yield can be increased.

In some embodiments, other required processes may be performed before the contact openings 136 are formed, and the description thereof is omitted here.

Referring to FIG. 1Q, contacts 138 (e.g., contacts 138a-138j) may be formed in the contact openings 136 (e.g., contact openings 136a-136j). Therefore, the contact 138 electrically connected to the pad 134 may be formed in the dielectric layer 122. For example, the contacts 138a-138j may be electrically connected to the pads 134a-134j, respectively. In some embodiments, the method of forming the contacts 138 may include the following steps. First, a contact material layer (not shown) filling the contact openings 136 may be formed. The contact material layer may be a single-layer structure or a multilayer structure. In some embodiments, the material of the contact material layer is, for example, tungsten, titanium, titanium nitride, or a combination thereof, but the invention is not limited thereto. In some embodiments, the method of forming the contact material layer is, for example, a physical vapor deposition (PVD) method or a CVD method. Then, the contact material layer outside the contact openings 136 may be removed to form the contacts 138. In some embodiments, the method of removing the contact material layer outside the contact openings 136 is, for example, a chemical mechanical polishing (CMP) method. In some embodiments, the top surface S7 of the contact 138 and the top surface S5 of the dielectric layer 122 may be coplanar. In some embodiments, the material of the contact 138 and the material of the pad 134 may be the same. In other embodiments, the material of the contact 138 and the material of the pad 134 may be different. The contact 138 may be a single-layer structure or a multilayer structure. In some embodiments, the material of the contact 138 is, for example, tungsten, titanium, titanium nitride, or a combination thereof, but the invention is not limited thereto.

Hereinafter, the semiconductor structure 10 of the present embodiment is described with reference to FIG. 1Q. In addition, although the method for forming the semiconductor structure 10 is described by taking the above method as an example, the invention is not limited thereto.

Referring to FIG. 1Q, a semiconductor structure 10 includes the substrate 100 and the pad structure 130. In some embodiments, the semiconductor structure 10 may be a 3D memory structure, but the invention is not limited thereto.

The pad structure 130 is located on the substrate 100. The pad structure 130 includes the material pairs 132 and the pads 134. The material pairs 132 are stacked on the substrate to form the stair step structure 104b. Each of the material pairs 132 includes the conductive layer 124 and the dielectric layer 108 located on the conductive layer 124. Each of the pads 134 includes the conductive pillar 126 and the pad layer 128. The conductive pillar is embedded in the material pair 132 and is connected to the conductive layer 124 of the material pair 132. The conductive pillar 126 may pass through the dielectric layer 108. The pad layer 128 is located on the conductive pillar 126. The pad layer 128 may be located and on the top surface S3 of the dielectric layer 108 of the material pair 132. In some embodiments, the pad layer 128 may be located on the top surface S3 of the dielectric layer 108 on two sides of the conductive pillar 126. In some embodiments, the cross-sectional shape of the pad 134 may be a T-shape. In some embodiments, the conductive layer 124, the conductive pillar 126, and the pad layer 128 may be integrally formed. In some embodiments, the bottom surface S8 of the conductive pillar 126 and the bottom surface S9 of the conductive layer 124 may be coplanar.

In some embodiments, the thickness T2 of the pad 134 may be greater than the thickness T3 of the conductive layer 124. In some embodiments, the thickness T2 of the pad may be 2 to 4 times the thickness T3 of the conductive layer 124. In some embodiments, the thickness T2 of the pad 134 may be greater than the thickness T4 of the material pair 132. In some embodiments, the width W2 of the pad layer 128 may be greater than the width W3 of the conductive pillar 126. In some embodiments, the thickness T5 of the pad layer 128 may be greater than or equal to half of the width W3 of the conductive pillar 126.

In some embodiments, the horizontal spacing SS between two adjacent pad layers 128 may be substantially equal to the thickness T5 of the pad layer 128. In some embodiments, the horizontal spacing SS may range from 90% to 110% of the thickness T5 of the pad layer 128.

In some embodiments, as shown in FIG. 1Q, the edge E1 of the pad layer 128 and the edge E2 of the conductive layer 124 may be flush with each other, but the invention is not limited thereto. In other embodiments, as shown in FIG. 1R, the edge E1 of the pad layer 128 may exceed the edge E2 of the conductive layer 124.

In some embodiments, the top-view pattern of the conductive pillar 126 may be a polygon, a circle, or an ellipse. In some embodiments, as shown in FIG. 2C, FIG. 3C, and FIG. 4C, the top-view pattern of the conductive pillar 126 may be a square shape (FIG. 2C) or a rectangle shape (FIG. 3C and FIG. 4C), but the invention is not limited thereto. In some embodiments, as shown in FIG. 2C, FIG. 3C, and FIG. 4C, the size of the top-view pattern of the pad layer 128 may be greater than the size of the top-view pattern of the conductive pillar 126. In some embodiments, as shown in FIG. 2C, there may be a gap G between the edge of the top-view pattern of the pad layer 128 and the edge of the top-view pattern of the conductive pillar 126, and the gap G may surround the top-view pattern of the conductive pillar 126. In some embodiments, as shown in FIG. 4C, two opposite side edges S10 of the top-view pattern of the pad layer 128 and two opposite side edges S11 of the top-view pattern of the conductive pillar 126 may be flush with each other.

In some embodiments, the semiconductor structure 10 may further include the protection layer 102. The protection layer 102 is located between the stair step structure 104b and the substrate 100. In some embodiments, the semiconductor structure 10 may further include the dielectric layer 122. The dielectric layer 122 covers the pad structure 130. In some embodiments, the semiconductor structure 10 may further include the contacts 138. The contacts 138 may be located in the dielectric layer 122. The contact 138 may be electrically connected to the pad 134. In some embodiments, the width W2 of the pad layer 128 may be greater than the width W4 of the bottom of the contact 138. In some embodiments, the contacts in different regions may have different landing depths.

Moreover, the details (e.g., the material, the forming method, and the effect) of each component in the semiconductor structure 10 have been described in detail in the above embodiments, and the description thereof is not repeated here.

Based on the above embodiments, in the semiconductor structure 10 and the manufacturing method thereof, each of the pads 134 includes the conductive pillar 126 and the pad layer 128, the conductive pillar 126 is embedded in the material pair 132 and is connected to the conductive layer 124 of the material pair 132, and the pad layer 128 is located on the conductive pillar 126. Therefore, compared with the conventional pad, the pad 134 of the above embodiments can have greater thickness, thereby preventing the electrical failure caused by over-etching during the process of manufacturing the contact opening 136. In addition, since the thicker pad 134 is used as the etching stop layer during formation of the contact opening 136, the process window of the contact opening 136 can be improved and the process yield can be increased.

In summary, in the semiconductor structure and the manufacturing method thereof of the aforementioned embodiments, each of the pads includes the conductive pillar and the pad layer, the conductive pillar is embedded in the material pair and is connected to the conductive layer of the material pair, and the pad layer is located on the conductive pillar. Therefore, compared with the conventional pad, the pad of the aforementioned embodiments can have greater thickness, thereby preventing the electrical failure caused by over-etching during the process of manufacturing the contact opening. In addition, since the thicker pad is used as the etching stop layer during formation of the contact opening, the process window of the contact opening can be improved and the process yield can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A semiconductor structure, comprising:
a substrate; and
a pad structure located on the substrate and comprising:
material pairs stacked on the substrate to form a stair step structure, wherein each of the material pairs comprises a conductive layer and a dielectric layer located on the conductive layer; and
pads, wherein each of the pads comprises:
a conductive pillar embedded in the material pair and connected to the conductive layer of the material pair; and
a pad layer located on the conductive pillar, wherein a thickness of the pad is greater than a thickness of the conductive layer.

2. The semiconductor structure according to claim 1, wherein a thickness of the pad is 2 to 4 times a thickness of the conductive layer.

3. The semiconductor structure according to claim 1, wherein a thickness of the pad is greater than a thickness of the material pair.

4. The semiconductor structure according to claim 1, wherein the conductive layer, the conductive pillar, and the pad layer are integrally formed.

5. The semiconductor structure according to claim 1, wherein a bottom surface of the conductive pillar and a bottom surface of the conductive layer are coplanar.

6. The semiconductor structure according to claim 1, wherein the pad layer is located on a top surface of the dielectric layer on two sides of the conductive pillar.

7. The semiconductor structure according to claim 1, wherein a width of the pad layer is greater than a width of the conductive pillar.

8. The semiconductor structure according to claim 1, wherein a thickness of the pad layer is greater than or equal to half of a width of the conductive pillar.

9. The semiconductor structure according to claim 1, wherein a top-view pattern of the conductive pillar comprises a polygon, a circle, or an ellipse.

10. The semiconductor structure according to claim 1, wherein a size of a top-view pattern of the pad layer is greater than a size of a top-view pattern of the conductive pillar.

11. The semiconductor structure according to claim 10, wherein there is a gap between an edge of the top-view pattern of the pad layer and an edge of the top-view pattern of the conductive pillar, and the gap surrounds the top-view pattern of the conductive pillar.

12. The semiconductor structure according to claim 1, wherein two opposite side edges of a top-view pattern of the pad layer and two opposite side edges of a top-view pattern of the conductive pillar are flush with each other.

13. The semiconductor structure according to claim 1, further comprising:
    contacts, wherein the contact is electrically connected to the pad.

14. The semiconductor structure according to claim 13, wherein a width of the pad layer is greater than a width of a bottom of the contact.

15. The semiconductor structure according to claim 13, wherein the contacts in different regions have different landing depths.

16. The semiconductor structure according to claim 1, further comprising:
    a protection layer located between the stair step structure and the substrate.

17. The semiconductor structure according to claim 1, wherein an edge of the pad layer exceeds an edge of the conductive layer.

18. The semiconductor structure according to claim 1, wherein a horizontal spacing between two adjacent pad layers is substantially equal to a thickness of the pad layer.

19. A manufacturing method of a semiconductor structure, comprising:
    providing a substrate; and
    forming a pad structure on the substrate, wherein the pad structure comprises:
        material pairs stacked on the substrate to form a first stair step structure, wherein each of the material pairs comprises a conductive layer and a first dielectric layer located on the conductive layer; and
        pads, wherein each of the pads comprises:
            a conductive pillar embedded in the material pair and connected to the conductive layer of the material pair; and
            a pad layer located on the conductive pillar, wherein a thickness of the pad is greater than a thickness of the conductive layer.

* * * * *